US009511498B2

(12) United States Patent
Higginson et al.

(10) Patent No.: US 9,511,498 B2
(45) Date of Patent: *Dec. 6, 2016

(54) MASS TRANSFER TOOL

(71) Applicant: LuxVue Technology Corporation, Santa Clara, CA (US)

(72) Inventors: John A. Higginson, Santa Clara, CA (US); Andreas Bibl, Los Altos, CA (US); David Albertalli, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/852,366

(22) Filed: Sep. 11, 2015

(65) Prior Publication Data

US 2016/0001450 A1 Jan. 7, 2016

Related U.S. Application Data

(63) Continuation of application No. 13/607,031, filed on Sep. 7, 2012, now Pat. No. 9,162,880.

(51) Int. Cl.
*B25J 15/00* (2006.01)
*B81C 99/00* (2010.01)
(Continued)

(52) U.S. Cl.
CPC .......... *B25J 15/0085* (2013.01); *B81C 99/002* (2013.01); *H01L 24/75* (2013.01); *H01L 24/95* (2013.01); *H02N 13/00* (2013.01)

(58) Field of Classification Search
CPC ..... B25J 15/0085; B81C 99/002; H01L 21/67; H01L 21/677; H01L 21/67703; H01L 21/68; H01L 21/681; H01L 21/6831; H01L 21/6833; H01L 2224/757; H01L 2224/75703
(Continued)

(56) References Cited

U.S. PATENT DOCUMENTS 3,717,743 A 2/1973 Costello
3,935,986 A 2/1976 Lattari et al.
(Continued)

FOREIGN PATENT DOCUMENTS

JP 07-060675 A 3/1995
JP 11-142878 5/1999
(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Stephen W Jackson
*Assistant Examiner* — Christopher Clark
(74) *Attorney, Agent, or Firm* — Blakely, Sokoloff, Taylor & Zafman LLP

(57) ABSTRACT

Systems and methods for transferring a micro device from a carrier substrate are disclosed. In an embodiment, a mass transfer tool includes an articulating transfer head assembly, a carrier substrate holder, and an actuator assembly to adjust a spatial relationship between the articulating transfer head assembly and the carrier substrate holder. The articulating transfer head assembly may include an electrostatic voltage source connection and a substrate supporting an array of electrostatic transfer heads.

18 Claims, 27 Drawing Sheets

(51) Int. Cl.
    *H01L 23/00*      (2006.01)
    *H02N 13/00*      (2006.01)

(58) Field of Classification Search
    USPC .......................................... 361/234; 29/740
    See application file for complete search history.

(56) References Cited

U.S. PATENT DOCUMENTS

| | | | |
|---|---|---|---|
| 5,131,582 A | 7/1992 | Kaplan et al. |
| 5,378,926 A | 1/1995 | Chi et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,585,703 B2 | 9/2009 | Matsumura et al. |
| 7,597,234 B2 | 10/2009 | Blessing et al. |
| 7,628,309 B1 | 12/2009 | Eriksen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,426,227 B1 | 4/2013 | Bibl et al. |
| 8,518,204 B2 | 8/2013 | Hu et al. |
| 8,646,505 B2 | 2/2014 | Bibl et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2005/0233546 A1 | 10/2005 | Oohata et al. |
| 2006/0038291 A1 | 2/2006 | Chung et al. |
| 2006/0055035 A1 | 3/2006 | Lin et al. |
| 2006/0055864 A1 | 3/2006 | Matsumura et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0247446 A1 | 10/2011 | Namoun et al. |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0120381 A1 | 5/2012 | Yasuda et al. |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0126081 A1 | 5/2013 | Hu et al. |
| 2013/0126891 A1 | 5/2013 | Bibl et al. |
| 2013/0127020 A1 | 5/2013 | Bibl et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2013/0176548 A1 | 7/2013 | Harb et al. |
| 2013/0285086 A1 | 10/2013 | Hu et al. |
| 2013/0300812 A1 | 11/2013 | Bibl et al. |
| 2014/0061687 A1 | 3/2014 | Hu et al. |
| 2014/0290047 A1 | 10/2014 | Mizuno et al. |

FOREIGN PATENT DOCUMENTS

| | | |
|---|---|---|
| JP | 3406207 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |

(56) References Cited

FOREIGN PATENT DOCUMENTS

| | | |
|---|---|---|
| JP | 2003-051466 A | 2/2003 |
| JP | 2004-095944 A | 3/2004 |
| JP | 2005-294824 A | 10/2005 |
| JP | 2008-135736 A | 6/2008 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2010-238905 A | 10/2010 |
| JP | 2011-181834 A | 9/2011 |
| JP | 2012-119399 A | 6/2012 |
| KR | 10-2005-0075280 A | 7/2005 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-008488 A | 7/2011 |
| WO | WO 2005-099310 A2 | 10/2005 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. Of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, Proceedings of Carts Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

PCT International Search Report and Written Opinion for International Application No. PCT/US2012/056912, mailed Nov. 6, 2012, 9 pages.

PCT Chapter I International Preliminary Report on Patentability (IPER) for PCT Application No. PCT/US2013/056912 mailed Mar. 10, 2015.

LuxVue Technology Corporation Office Action for Japanese Patent Application No. 2015-531125 mailed Apr. 15, 2016.

SECTION A-A

SECTION B-B

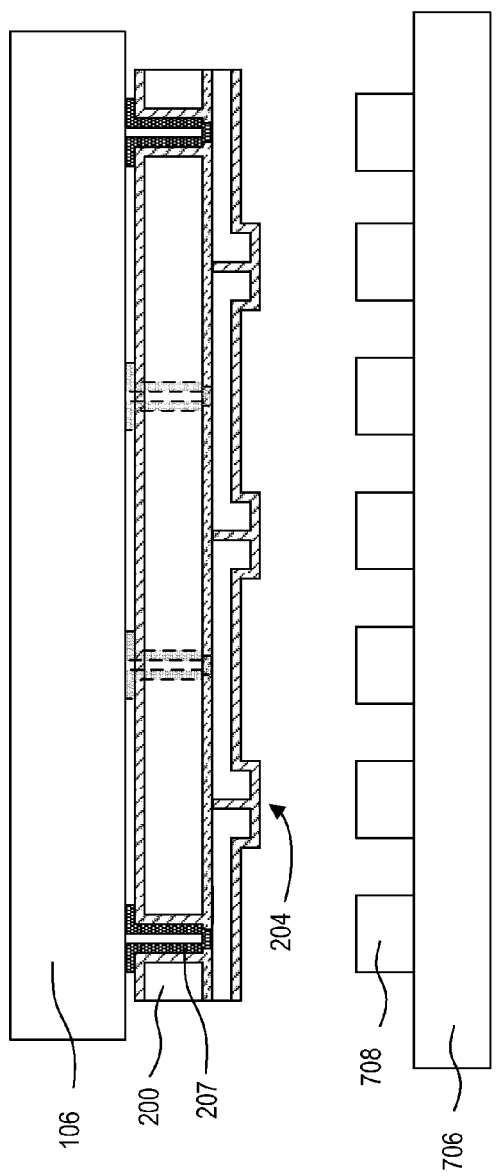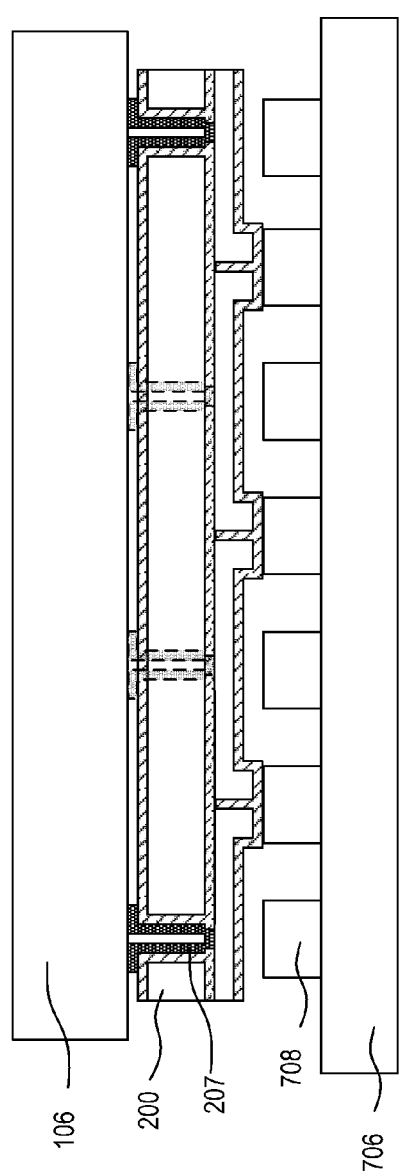
FIG. 19A
FIG. 19B

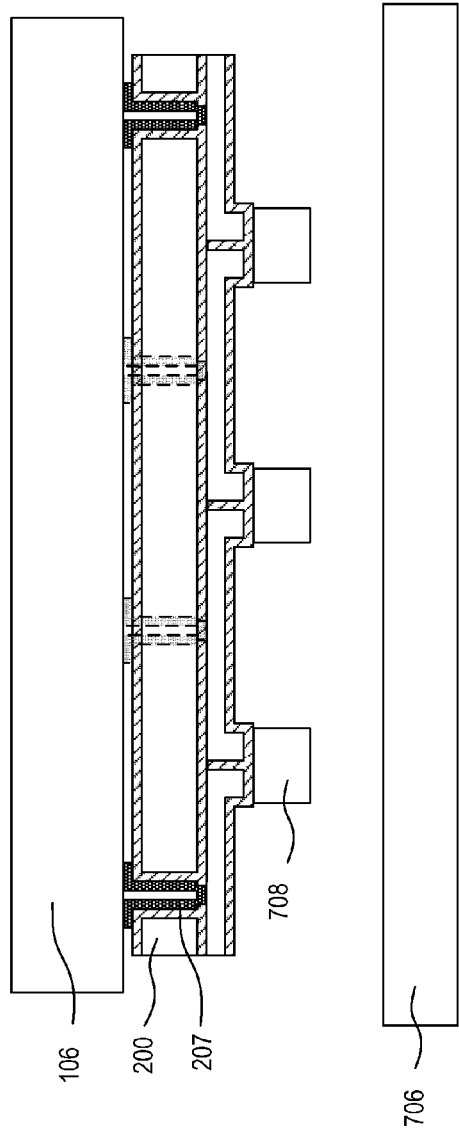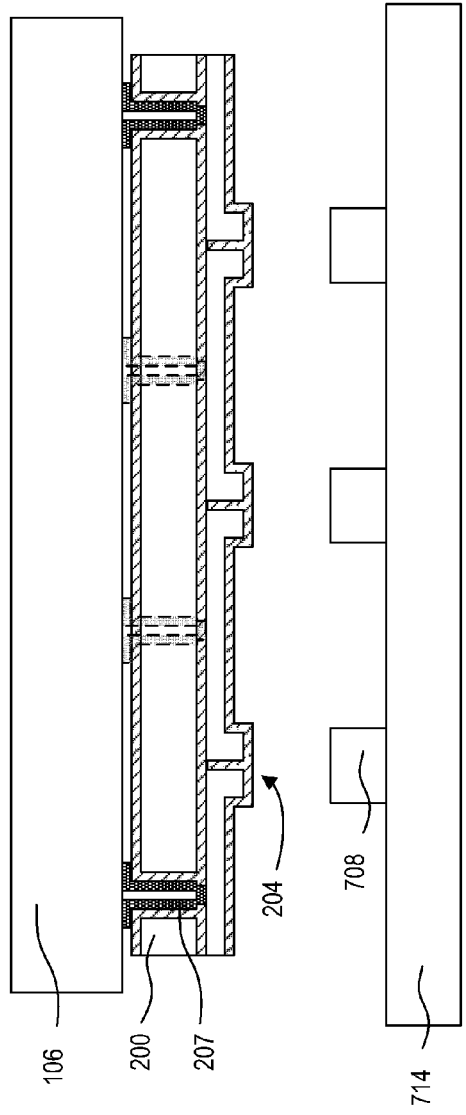

MASS TRANSFER TOOL

RELATED APPLICATIONS

This application is a continuation of co-pending U.S. patent application Ser. No. 13/607,031, filed on Sep. 7, 2012, the full disclosure of which is incorporated herein by reference.

BACKGROUND

The present invention relates to micro devices. More particularly, embodiments of the present invention relate to systems and methods for transferring a micro device from a carrier substrate.

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

SUMMARY OF THE DESCRIPTION

A mass transfer tool and methods of operating the mass transfer tool are disclosed. In an embodiment, a mass transfer tool includes an articulating transfer head assembly having an electrostatic voltage source connection and a substrate supporting an array of electrostatic transfer heads. The substrate can be releasably attachable to a mounting surface of the transfer head assembly and electrically connectable with the electrostatic voltage source connection. For example, the mounting surface can include a vacuum port coupled with a vacuum source to apply suction to the substrate. In an embodiment, the electrostatic voltage source connection can include a resilient conductor that presses against the substrate. The mass transfer tool can also include a carrier substrate holder, a receiving substrate holder, and an actuator assembly to adjust a spatial relationship between the articulating transfer head assembly and the carrier substrate holder or the receiving substrate holder. For example, the actuator assembly can adjust the spatial relationship in at least six degrees of freedom. More particularly, the actuator assembly can include a first actuator subassembly coupled with the articulating transfer head assembly to adjust an articulating transfer head assembly position in at least four degrees of freedom and a second actuator subassembly coupled with the carrier substrate holder to adjust a carrier substrate holder position in at least two degrees of freedom. The second actuator subassembly may also be coupled with the receiving substrate holder to adjust a receiving substrate holder position in at least two degrees of freedom. Alternatively, the receiving substrate holder may be coupled with a separate actuator subassembly. Even more particularly, the first actuator assembly can include a first flexure coupled with the articulating transfer head assembly to constrain movement of the articulating transfer head assembly in a direction orthogonal to a contact surface of the array of electrostatic transfer heads. The first actuator assembly can also include a second flexure coupled with the articulating transfer head assembly that includes a second flexing surface oriented substantially parallel to the first flexing surface.

In an embodiment, the mass transfer tool can include one or more heaters to heat the substrate, the carrier substrate holder, and the receiving substrate holder. For example, the articulating transfer head may include a heater, and the carrier and receiving substrate holder can each be coupled to a heater.

In an embodiment, the mass transfer tool can include a first position sensor fixed relative to the mounting surface to detect a position of a carrier substrate on the carrier substrate holder. The mass transfer tool can also include a second position sensor fixed relative to the carrier substrate holder to detect the articulating transfer head assembly position. Further still, the mass transfer tool can include a third position sensor coupled with the actuator assembly to detect a deflection of the first flexing surface. Each of these position sensors can be spectral-interference laser displacement meters. In yet another embodiment, the mass transfer tool can include a force gauge coupled with the carrier substrate holder to measure a force applied to the carrier substrate holder.

In an embodiment, the mass transfer tool can include one or more imaging devices, such as cameras. For example, a first imaging device fixed relative to the articulating transfer head assembly can have a first imaging plane. Further, the mass transfer tool can also include a second imaging device fixed relative to the carrier substrate holder that can have a second imaging plane. A fiducial mark may be located between the first imaging plane and the second imaging plane of the imaging devices. By way of example, the fiducial mark can be an asymmetric pattern that is part of a transparent plate.

In an embodiment, a method of operating the mass transfer tool includes establishing a frame of reference comprising an x-axis and an x-y plane, and aligning a substrate supporting an array of electrostatic transfer heads with the frame of reference. In an embodiment, the frame of reference is established by setting an x-y datum and setting a z-datum. The x-y datum may be set by aligning a first and second imaging devices to a fiducial mark between the first and second imaging devices. For example, the x-y datum may be set by aligning a first imaging device having a first imaging plane and a second imaging device having a second imaging plane with a fiducial mark located between the first imaging plane and the second imaging plane. By way of example, the imaging devices can be cameras. The first and second imaging planes can be parallel to the x-y plane. The z-datum may be set by sending a first and second coplanar surfaces that are between a first and second position sensors and parallel to an x-y plane having the x-y datum. For example, the z-datum may be set by sensing a first and second surface of a z-gauge with a first and second position sensor, respectively. The position sensors can both have sensing directions orthogonal to the x-y plane, and the first and second surfaces can be coplanar and parallel to the x-y plane. By way of example, the position sensors can be spectral-interference laser displacement sensors. The z-gauge can be releasably attached to the mounting surface of the mass transfer tool. For example, the z-datum can be distanced 100 micrometers or less from a contact surface of the array of electrostatic transfer heads.

In an embodiment, the substrate is aligned with the frame of reference by articulating and rotating the articulating transfer head assembly. The articulating transfer head assembly is articulated to align the array of electrostatic transfer heads parallel to the x-y plane. This articulating can include detecting a distance to each of four reference points on the substrate and moving the articulating transfer head assembly until the distance to each of the four reference points is equal. The reference points can be detected with a first position sensor, such as a spectral-interference laser displacement sensor, having a sensing direction orthogonal to the x-y plane. The articulating transfer head assembly may be rotated to align a reference line passing through a first reference mark and a second reference mark of the substrate parallel to the x-axis. This rotating can include detecting the first reference mark and the second reference mark with a first imaging device, such as a camera, having a first imaging plane parallel to the x-y plane. The first reference mark and second reference mark can be electrostatic transfer heads.

In an embodiment, establishing the frame of reference including heading the articulating transfer head assembly to a temperature used in an subsequent transfer operation. For example, the mounting surface of the articulating transfer head assembly is heated to a temperature range of about 100 to 350 degrees Celsius. In an embodiment, the substrate supporting the array of electrostatic transfer heads is heated to a temperature range of about 100 to 350 degrees Celsius when aligning the substrate with the frame of reference.

In an embodiment, a method of operating the mass transfer tool includes adjusting a spatial relationship between an articulating transfer head assembly and a carrier substrate holder with an actuator assembly. An array of micro devices on a carrier substrate on the carrier substrate holder is contacted by an array of electrostatic transfer heads coupled with the articulating transfer head assembly. Voltage is applied to the array of electrostatic transfer heads through an electrostatic voltage source connection of the articulating transfer head assembly and the array of micro devices is picked up from the carrier substrate.

Adjusting the spatial relationship can include determining an orientation of the carrier substrate on the carrier substrate holder and matching an orientation of the substrate coupled with the articulating transfer head assembly to that orientation. Determining the orientation of the carrier substrate can include detecting a distance to each of four reference points on the carrier substrate with a first position sensor, such as a spectral-interference laser displacement sensor, having a first sensing direction orthogonal to the x-y plane. Furthermore, a first imaging device, such as a camera, having a first imaging plane parallel to the x-y plane, can detect a first reference mark and a second reference mark on the carrier substrate. In an embodiment, the first imaging device can also detect the distance to each of four reference points on the carrier substrate by determining a focal length. Matching the orientations of the substrate and the carrier substrate includes rotating and articulating the articulating transfer head assembly. The articulating transfer head assembly is rotated to align a reference line passing through a first reference mark and a second reference mark of the substrate parallel to a line passing through a first reference mark and second reference mark of the carrier substrate. The rotating can include detecting the first and second reference marks with first and second imaging devices having respective first and second imaging planes that are parallel to the x-y plane. The articulating transfer head assembly is articulated to align the array of electrostatic transfer heads parallel to the carrier substrate. The articulating can include detecting a distance to each of four reference points on the carrier substrate with a first position sensor having a first sensing direction orthogonal to the x-y plane and moving the articulating transfer head assembly until the substrate is parallel to the carrier substrate.

In an embodiment, contacting the carrier substrate with the array of micro devices includes sensing contact. For example, contact can be sensed by sensing a deflection of a flexure coupled with the articulating transfer head assembly using a first position sensor, such as a spectral-interference laser displacement sensor. In an embodiment, the spectral-interface laser displacement sensor is capable of differentiating a 50 nanometer deflection of the flexure. Alternatively, contact can be sensed based on a change in a load applied to the carrier substrate holder, as measured by a force gauge coupled with the carrier substrate holder. In an embodiment, the force gauge can measure with at least a microgram resolution.

Picking up the micro devices can include sensing removal of the array of micro devices from the carrier substrate based on a deflection of a flexure coupled with the articulating transfer head assembly. The deflection can be sensed by a first position sensor, such as a spectral-interference laser displacement sensor coupled with the actuator assembly. Alternatively, removal of the array of micro devices from the carrier substrate can be sensed based on a change in a load applied to the carrier substrate holder as measured by a force gauge coupled with the carrier substrate holder. In an embodiment, the force gauge can measure with at least a microgram resolution. In an embodiment, after picking up the array of micro devices from the carrier substrate, attachment of the array of micro devices to the array of electrostatic transfer heads is confirmed, for example by optical inspection of the electrostatic transfer head or carrier substrate.

In an embodiment, a method of operating the mass transfer tool includes contacting a receiving substrate coupled with a receiving substrate holder using the array of micro devices. Contact can be sensed in several manners. For example, contact can be sensed by sensing a deflection of a flexure coupled with the articulating transfer head assembly using a first position sensor, such as a spectral-interference laser displacement sensor coupled with the actuator assembly. Alternatively, contact can be sensed based on a change in a load applied to the receiving substrate holder, as measured by a force gauge coupled with the receiving substrate holder. In an embodiment, the force gauge can measure with at least a microgram resolution.

In an embodiment, the voltage can be removed from the array of electrostatic transfer heads. The array of electrostatic transfer heads can then be removed from the array of micro devices on the receiving substrate. Removal of the electrostatic transfer heads from the micro devices can be sensed in several manners. For example, removal can be sensed by sensing a deflection of a flexure coupled with the articulating transfer head assembly using a first position sensor, such as a spectral-interference laser displacement sensor coupled with the actuator assembly. Alternatively, removal can be sensed based on a change in a load applied to the receiving substrate holder, as measured by a force gauge coupled with the receiving substrate holder. In an embodiment, the force gauge can measure with at least a microgram resolution. In an embodiment, after removing the electrostatic transfer heads from the micro devices, release of the array of micro devices from the array of electrostatic transfer heads is confirmed, for example by optical inspection of the electrostatic transfer head or receiving substrate.

BRIEF DESCRIPTION OF THE DRAWINGS

FIG. 19A is a cross-sectional side view illustration of an array of electrostatic transfer heads positioned over an array of micro devices on a carrier substrate after the spatial relationship between the articulating transfer head assembly and the carrier substrate holder has been adjusted in accordance with an embodiment of the invention.

FIG. 19B is a cross-sectional side view illustration of an array of electrostatic transfer heads in contact with an array of micro devices in accordance with an embodiment of the invention.

FIG. 19C is a cross-sectional side view illustration of an array of electrostatic transfer heads picking up an array of micro devices in accordance with an embodiment of the invention.

FIG. 19D is a cross-sectional side view illustration of an array of micro devices released onto a receiving substrate in accordance with an embodiment of the invention.

DETAILED DESCRIPTION

Figure 1:
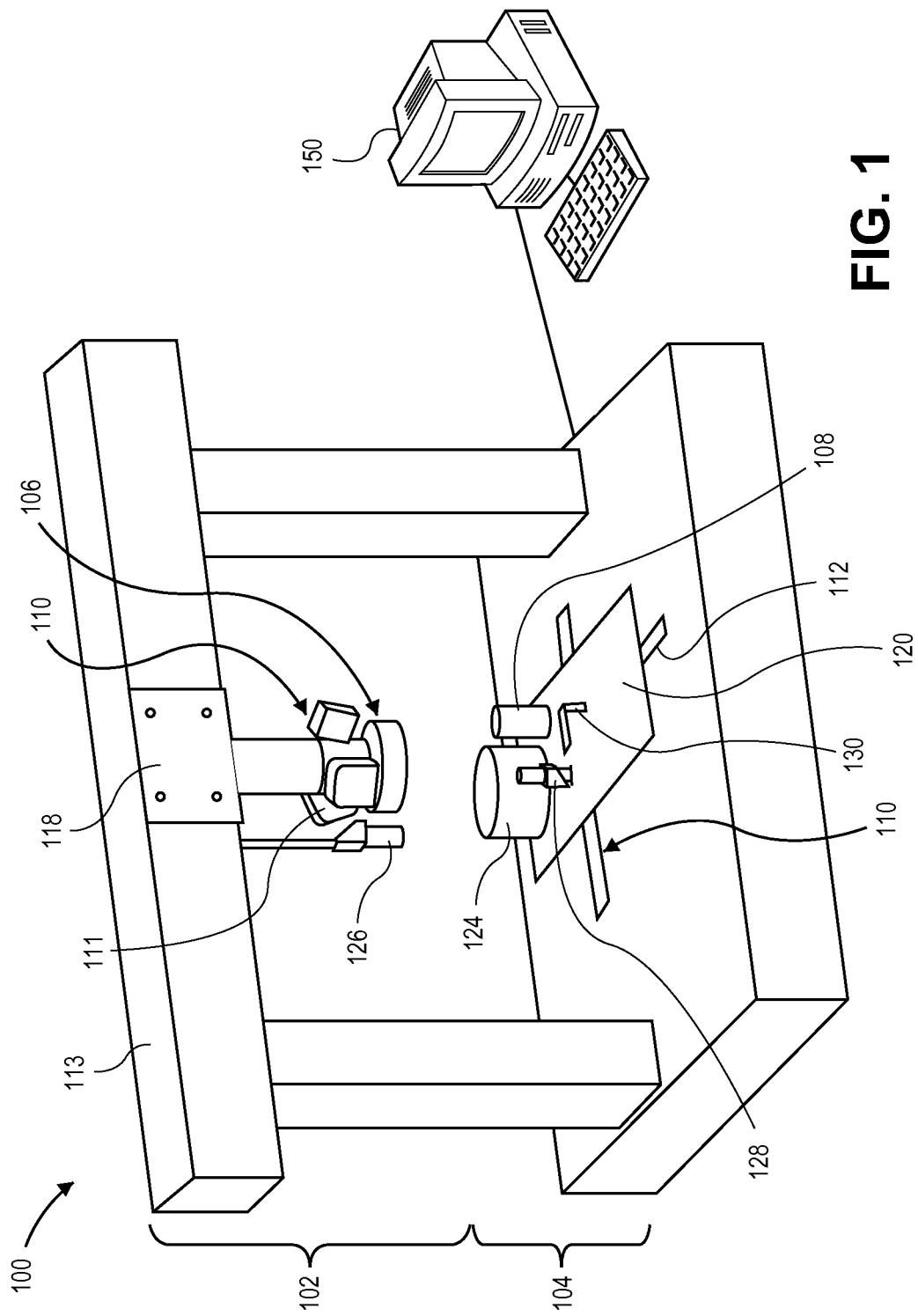
FIG. 1 is a perspective view illustration of a mass transfer tool in accordance with an embodiment of the invention.

Embodiments of the present invention describe systems and methods for transferring a micro device or an array of micro devices from a carrier substrate. In some embodiments, the micro devices or array of micro devices described herein may be any of the micro LED device structures illustrated and described in related U.S. patent application Ser. Nos. 13/372,222, 13/436,260, and 13/458,932. While some embodiments of the present invention are described with specific regard to micro LED devices, it is to be appreciated that embodiments of the invention are not so limited and that certain embodiments may also be applicable to other micro LED devices as well as other micro devices such as diodes, transistors, ICs, and MEMS.

In various embodiments, description is made with reference to the figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known processes and manufacturing techniques have not been described in particular detail in order to not unnecessarily obscure the present invention. Reference throughout this specification to "one embodiment," "an embodiment", or the like, means that a particular feature, structure, configuration, or characteristic described in connection with the embodiment is included in at least one embodiment of the invention. Thus, the appearances of the phrase "one embodiment," "an embodiment", or the like, in various places throughout this specification are not necessarily referring to the same embodiment of the invention. Furthermore, the particular features, structures, configurations, or characteristics may be combined in any suitable manner in one or more embodiments.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 µm. However, it is to be appreciated that embodiments of the present invention are not necessarily so limited, and that certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 µm. In an embodiment, the top contact surface of each electrostatic transfer head has a maximum dimension of 1 to 100 µm, or more specifically 3 to 10 µm. In an embodiment a pitch of an array of micro devices, and a corresponding array of electrostatic transfer heads is (1 to 100 µm) by (1 to 100 µm), for example a 10 µm by 10 µm pitch or 5 µm by 5 µm pitch.

In one aspect, embodiments of the invention describe a manner for mass transfer of an array of pre-fabricated micro devices with an array of electrostatic transfer heads. For example, the pre-fabricated micro devices may have a specific functionality such as, but not limited to, an LED for light-emission, silicon IC for logic and memory, and gallium arsenide (GaAs) circuits for radio frequency (RF) communications. In some embodiments, arrays of micro LED devices which are poised for pick up have a micro sized pitch such as a 10 µm by 10 µm pitch or 5 µm by 5 µm pitch. At these densities a 6 inch substrate, for example, can accommodate approximately 165 million micro LED devices with a 10 µm by 10 µm pitch, or approximately 660 million micro LED devices with a 5 µm by 5 µm pitch. A mass transfer tool including an array of electrostatic transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of electrostatic transfer heads can pick up and transfer more than 100,000 micro devices, with larger arrays of electrostatic transfer heads being capable of transferring more micro devices.

In another aspect, embodiments of the invention describe systems and methods that facilitate the mass transfer of micro devices using a substrate that supports the array of electrostatic transfer heads to apply an electrostatic force to the micro devices. In an embodiment, the substrate can be removed and reattached to the system, i.e., the substrate can be replaceable. Since the substrate is removable, the system and substrate can be more easily inspected, cleaned, and refurbished. Given that the substrate can have a life span corresponding to a rate of wear of the array of electrostatic transfer heads, the removal of the substrate allows for exchange of the used substrate before the array electrostatic transfer heads fail. Thus, a system with a replaceable substrate can improve system longevity and increase system reliability.

In another aspect, embodiments of the invention describe systems and methods of transferring an array of micro devices at elevated temperatures above room temperature. In some embodiments, pick up of the array of micro devices from a carrier substrate and/or placement of the array of micro devices on a receiving substrate may be performed at elevated temperatures, for example to create a phase change in a bonding layer connecting the array of micro devices to a carrier substrate or to create a phase change or alloy a bonding layer during placement of the array of micro devices on a receiving substrate. In some embodiments, where one or more operations during transfer from the carrier substrate to the receiving substrate are performed at an elevated temperature, the alignment operations of the mass transfer tool are also performed at the elevated operating temperature to compensate for shift in the transfer tool components due to thermal expansion.

In another aspect, embodiments of the invention describe systems and methods that facilitate the mass transfer of micro devices using an actuator assembly and various sensors that provide feedback related to the position of system components. The actuator assembly can include any number of actuators capable of generating motion of system components relative to one or more frames of reference and other system components. For example, the actuator assembly can move a substrate supporting an array of electrostatic transfer heads and an array of micro devices relative to one another in at least six degrees of freedom on a carrier substrate. Furthermore, the actuator assembly can be used for precise alignment and movement of system components. To enable precise motion control, various sensors can be used to provide feedback to a computer system or controller relating to the location and position of system components. For example, the sensors can detect locations of system components with resolutions of about 50 nanometers and actuators can be controlled, i.e., actuated, according to those locations. Thus, the combined actuator assembly and sensors enable spatial relationships of system components to be adjusted on a micrometer scale. As an example, the array of electrostatic transfer heads can be aligned parallel to the location of the array of micro devices within about one micrometer. Thus, it will be appreciated that a system with an actuator assembly and sensors as described below can precisely pick up and transfer the array of micro devices with high process throughput and yield.

In yet another aspect, embodiments of the invention describe systems and methods that facilitate the mass transfer of micro devices using sensors to sense the application or removal of contact between system components. For example, a position sensor or a force gauge can sense contact between an array of electrostatic transfer heads and an array of micro devices. Furthermore, actuators can be controlled, i.e., actuated, according to the contact. The position sensor or force gauge can similarly sense removal of the array of micro devices from a carrier substrate. Thus, it will be appreciated that a system with sensors to sense the application of contact between system components can precisely pick up and transfer the array of micro devices with high process throughput and yield.

Referring now to FIG. 1, a perspective view illustration of a mass transfer tool is shown in accordance with an embodiment of the invention. The mass transfer tool 100 operates according to the aspects described above. To do so, the mass transfer tool 100 includes one or more assemblies having various components and sub-assemblies with functions that facilitate the mass transfer of micro devices using an array of electrostatic transfer heads. For example, the mass transfer tool 100 can include an upper assembly 102 having an articulating transfer head assembly 106 to receive a substrate containing an array of electrostatic transfer heads, as will be described further below. The articulating transfer head assembly 106 can include features that allow for the exchange of the substrate and for delivering a voltage to the electrostatic transfer heads to facilitate pick up of a micro device using an electrostatic force, as will be described further below.

The mass transfer tool 100 can also include a lower assembly 104 having a carrier substrate holder 108 and a receiving substrate holder 124. The carrier substrate holder 108 can be configured to hold a carrier substrate supporting an array of micro devices. Furthermore, the receiving substrate holder 124 can be configured to hold a receiving substrate for receiving the transferred micro devices. Thus, the array of micro devices can be transferred from the carrier substrate to the receiving substrate using the array of electrostatic transfer heads, as will be described further below.

It will be appreciated that any reference to upper assembly 102 and lower assembly 104 is made for ease of description only, and that components and subassemblies of mass transfer tool 100 may be part of either or both of the upper assembly 102 and the lower assembly 104. For example, both the upper assembly 102 and lower assembly 104 can include components of an actuator assembly 110. The actuator assembly 110 moves various components of the mass transfer tool 100, and more specifically, it can adjust spatial relationships between components in order to facilitate the transfer of micro devices using an array of electrostatic transfer heads on a substrate. For example, the articulating transfer head assembly 106 and the carrier substrate holder 108 and receiving substrate holder 124 can be adjusted such that the array of electrostatic transfer heads supported by the substrate attached to an articulating transfer head assembly conforms closely to a carrier substrate held by the carrier substrate holder or receiving substrate held by the receiving substrate holder. These types of adjustments require precise movements in multiple degrees of freedom. For example, the articulating transfer head assembly 106 can be moved by a tripod actuator 111 of the actuator assembly 110 having at least four degrees of freedom. Similarly, the carrier substrate holder 108 can be moved by an x-y stage 112 of the actuator assembly 110 having at least two degrees of freedom. Thus, the array of electrostatic transfer heads supported by the substrate attached to the articulating transfer head assembly and the array of micro devices supported by the carrier substrate held by the carrier substrate holder, as well as the receiving substrate held by the receiving substrate holder, can be precisely moved relative to each other with six degrees of freedom. It will be appreciated that the actuator assembly 110 is one of many possible configurations and it can include any number of components. For example, while the particular embodiment illustrated in FIG. 1 illustrates an x-y stage 112 in the lower assembly 104 only, it is contemplated that the articulating transfer head assembly 106 in the upper assembly 102 can be mounted on an x-y stage in addition to, or alternative to x-y stage 112. Thus, a variety of configurations are contemplated in accordance with embodiments of the invention which are capable of adjusting the spatial relationships between components in at least six degrees of freedom.

In addition to sharing components of the actuator assembly 110, the upper assembly 102 and the lower assembly 104 can also include various sensors that are intended to sense spatial relationships, e.g., contact, between system components and to work together with the actuator assembly 110 to facilitate alignment of system components. For example, a downward-looking imaging device 126 and an upward-looking imaging device 128 can be aligned with one another using an alignment tool 130 in order to establish a frame of reference that components can be adjusted within. Similarly, position sensors (not shown) can be integrated within the mass transfer tool 100 and mounted relative to a carriage 120 and the articulating transfer head assembly 106 to further establish the frame of reference that components can be adjusted within. The various sensors can also be used to detect positions of components within the frame of reference and to provide feedback to a computer system 150 capable of receiving and processing inputs in order to control the system components accordingly. These and other sensors will be described in greater detail below.

The various components and subassemblies can be coupled in various manners, e.g., through the use of a gantry 113, base 114, side beams 116, bracket 118, and other structural connectors. Therefore, it will be appreciated that the mass transfer tool 100 shown in FIG. 1 is not exhaustive of all components that can be part of a system in accordance with the scope of this invention, nor should the description be considered to be limiting in this regard. Having described the mass transfer tool 100 at a high level, the mass transfer tool 100 components and structure will now be addressed in more specific detail.

Figure 2:
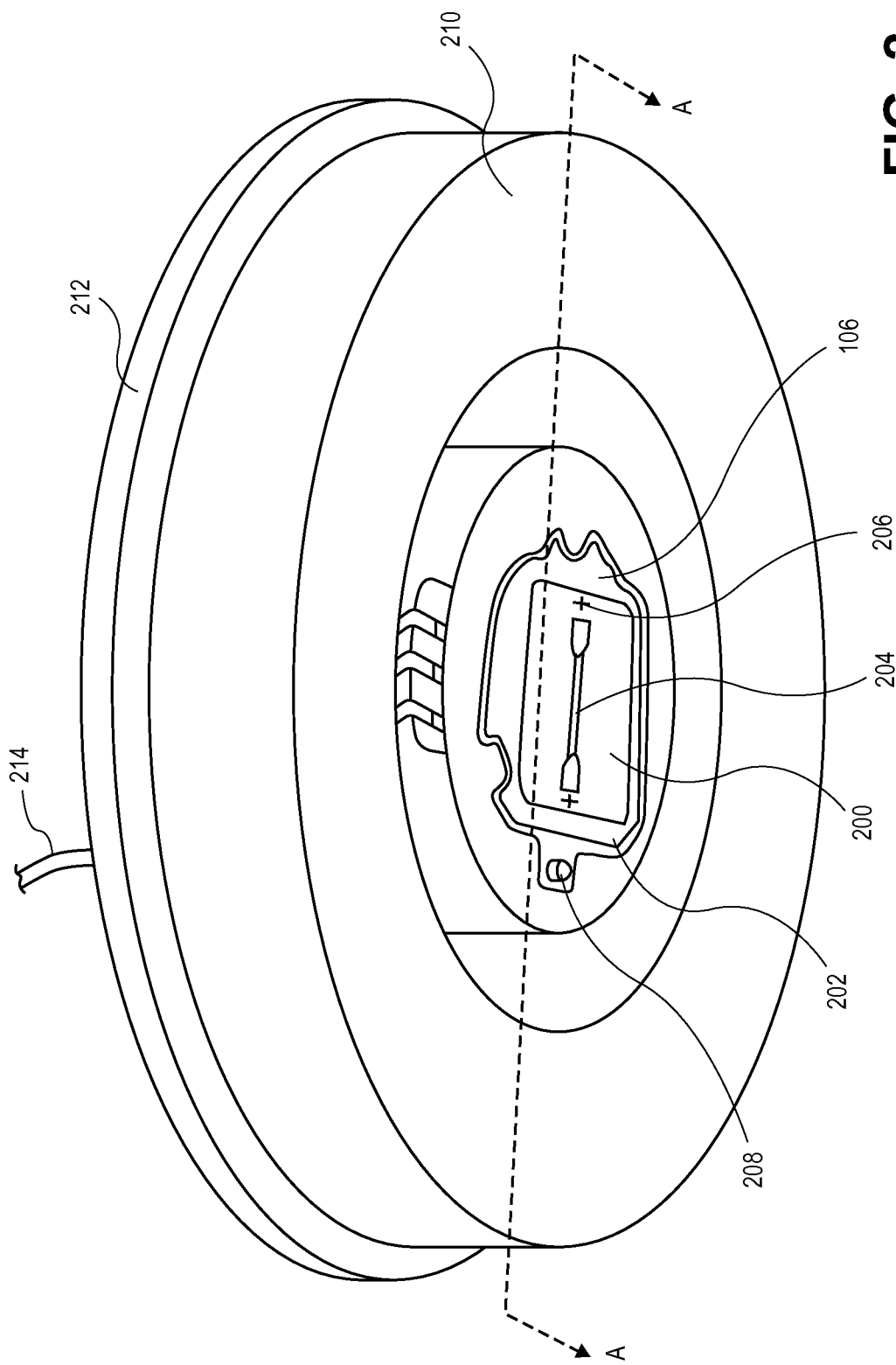
FIG. 2 is a perspective view illustration of an upper assembly portion of a mass transfer tool having an articulating transfer head assembly in accordance with an embodiment of the invention.

Referring now to FIG. 2, a bottom perspective view illustration of an upper assembly portion of a mass transfer tool including an articulating transfer head assembly is shown in accordance with an embodiment of the invention. As discussed above, the mass transfer tool 100 can include an articulating transfer head assembly 106 to receive a replaceable substrate 200 supporting an array of electrostatic transfer heads 204. The substrate 200 is shown attached to the articulating transfer head assembly 106. More particularly, the substrate 200 is attached to a mounting surface 202 of the articulating transfer head assembly 106. The substrate 200 may be formed from a variety of materials such as silicon, ceramics, and polymers, which are capable of providing structural support. In an embodiment, the substrate 200 also includes wiring or vias that connect with the array of electrostatic transfer heads 204. Each transfer head can further include a mesa structure, an electrode which may be formed over the mesa structure or integrally formed with the mesa structure, and a dielectric layer covering the electrode. The array of electrostatic transfer heads 204 can be formed with a pitch selected to match an integer multiple of a pitch of micro devices placed on a carrier substrate (not shown), as described below. In an embodiment, the array of electrostatic transfer heads 204 are any of the arrays of transfer heads described in related U.S. patent application Ser. Nos. 13/372,277, 13/466,966, 13/481,592, 13/543,675, and 13/543,684 each of which is incorporated herein by reference. The substrate 200 can also include one or more reference marks 206 to permit accurate positioning and alignment of the substrate 200, as described below.

The articulating transfer head assembly can be encompassed by a housing 210. Housing 210 can protect the articulating transfer head assembly 106 by separating it from external objects. Furthermore, housing 210 can support components of actuator assembly 110 components, such as a flexure and an axial actuator, which will be described further below. These actuator assembly 110 components can facilitate movement of the articulating transfer head assembly 106. In at least one embodiment the housing 210 and the articulating transfer head assembly 106 can move relative to each other. In addition to being coupled with the articulating transfer head assembly 106 by various actuators, the housing 210 can also be coupled to a mounting plate 212, which is either part of, or coupled to, other actuator assembly 110 components. For example, mounting plate 212 can be coupled to tripod 111 to permit actuation of the housing 210 and articulating transfer head assembly 106.

As discussed above, the mass transfer tool 100 can include various sensors to measure and detect distances, and thus, to provide a control feedback that aids in the adjustment of the actuator assembly 110. FIG. 2 shows one such sensor included in the articulating transfer head assembly 106, i.e., position sensor 208. Position sensor 208 can have a position sensor lead 214 to communicate signals directly or indirectly with computer system 150. The position sensor 208 can terminate in a distal end that is approximately coplanar with the mounting surface 202. Furthermore, the distal end of the position sensor 208 can be fixed relative to the mounting surface 202. As a result, the position sensor 208 can detect a distance to a surface relative to the mounting surface 202. For example, when a spatial relationship between the articulating transfer head assembly 106 and the carrier substrate holder 108 is adjusted by the actuator assembly 110, the position sensor 208 can provide feedback relating to a distance between the mounting surface 202 of the articulating transfer head assembly 106 and the carrier substrate holder 108. This feedback may be informational, e.g., to provide a visual display of mass transfer tool status to a user, or it may be part of a positive feedback loop to control motion of the actuator assembly 110.

In addition to sensing the spatial relationship between the articulating transfer head assembly 106 and the carrier substrate holder 108, the position sensor 208 can be used to sense the spatial relationship between other components. For example, the position sensor 208 can be used to sense directly or indirectly a distance between the array of electrostatic transfer heads 204 supported by a substrate 200 attached to the mounting surface 202 and a carrier substrate held by the carrier substrate holder 108.

In an embodiment, the position sensor 208 can include a spectral-interference laser displacement meter, such as a micro-head spectral-interference laser displacement meter manufactured by the Keyence Corporation of Osaka, Japan. The use of a spectral-interference laser displacement meter provides the advantage of absolute displacement measurement, without the necessity of meter calibration. Such capability can provide the benefit of increased efficiency in the applications described herein because there is less need for time consuming mass transfer tool alignment when, e.g., a substrate 200 is exchanged during operation. Furthermore, the spectral-interference laser displacement meter can sense multiple surfaces without the need for recalibration between sensing locations. Nevertheless, one skilled in the art will appreciate that position sensor 208 can include other types of sensors, including proximity sensors, optical sensors, and ultrasonic sensors.

Figure 3:
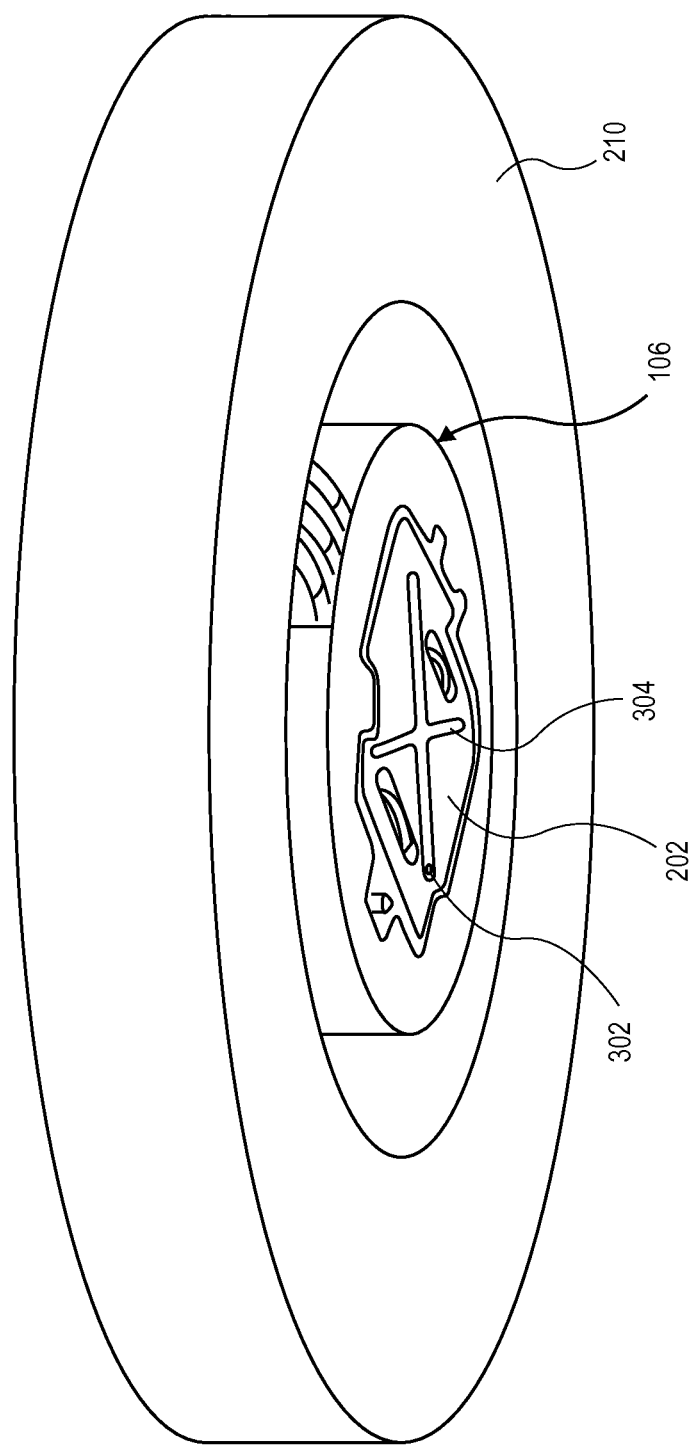
FIG. 3 is a perspective view illustration of an upper assembly portion of a mass transfer tool having an articulating transfer head assembly in accordance with an embodiment of the invention.

Referring now to FIG. 3, a perspective view illustration of an upper assembly portion of a mass transfer tool having an articulating transfer head assembly is shown in accordance with an embodiment of the invention. In this illustration, substrate 200 is not attached to the mounting surface 202. Thus, as described above, in at least one embodiment the substrate 200 can be releasably attached and detached from the mounting surface 202. In an embodiment, the mounting surface 202 can include at least one vacuum port 302 coupled with a vacuum source (not shown) for drawing suction on an object placed against the mounting surface 202. More particularly, when the substrate 200, is positioned against the mounting surface 202, suction is drawn through vacuum port 302 to create a negative pressure within one or more vacuum channels 304. As shown, vacuum channels 304 can be formed in a pattern of intersecting lines to create a suction area. Thus, the substrate 200 is pushed against the mounting surface 202 by the pressure difference between the vacuum channels 304 and the surrounding atmosphere. As a result, the substrate 200 attaches to the mounting surface 202. When the vacuum source is disconnected or the negative pressure in the vacuum channels 304 is insufficient to retain the substrate 200, the attachment is released and the substrate 200 can be removed.

Although mounting surface 202 can be generally flat as shown in FIG. 3, it will be appreciated that the mounting surface 202 may instead have various contours. For example, in an embodiment, the mounting surface 202 can be wedge shaped or otherwise contoured to provide a reference feature that the substrate 200 can rest against. That is, in the case of a wedge shaped mounting surface 202 and a wedge shaped substrate 200, the substrate 200 will be known to be oriented in the same angular orientation each time it is removed and installed within the wedge contour.

Figure 4:
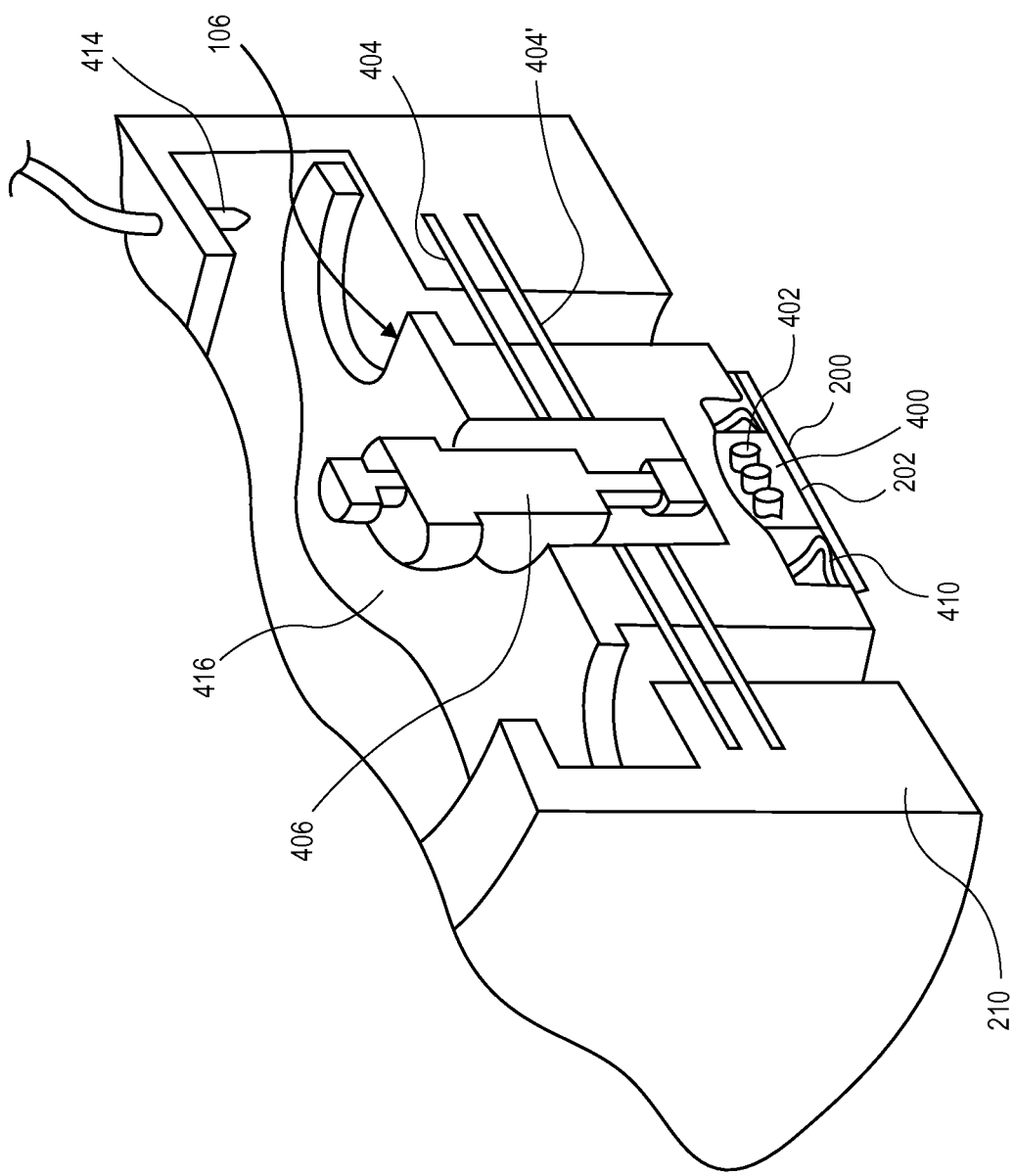
FIG. 4 is a cross-sectional perspective view illustration taken about line A-A of FIG. 2 of an upper assembly portion of a mass transfer tool having an articulating transfer head assembly in accordance with an embodiment of the invention.

Referring now to FIG. 4, a cross-sectional perspective view illustration taken about line A-A of FIG. 2 of a portion of an upper assembly portion of a mass transfer tool having an articulating transfer head assembly is shown in accordance with an embodiment of the invention. The substrate 200 is shown attached to the mounting surface 202 of the articulating transfer head assembly 106. In an embodiment, the mounting surface 202 is thermally coupled with a heater 400. For example, the heater 400 may include one or more heating elements 402, such as heater rods, that generate heat in response to the application of electrical current. The heating elements 402 can increase in temperature to transfer heat to the substrate 200. For example, heat can be conducted through a metal block (not shown). Alternatively, heat can be conveyed to the substrate 200 by convective or radiant heating across intervening air gaps. In one aspect, the heater 400 can be configured to raise the temperature of the mounting surface 202 to a range of about 50 to 500 degrees Celsius. More particularly, the heater 400 can be configured to raise the temperature of the mounting surface 202 to a range of about 100 to 350 degrees Celsius. It will be appreciated that other temperatures and temperature ranges may be contemplated within the scope of this disclosure.

It will be appreciated that the heating of the mounting surface 202 will result in transfer of heat to the array of electrostatic transfer heads 204 supported by the substrate 200, and thus, heat can be delivered to an array of micro devices that the array of electrostatic transfer heads come into contact with. This heat can facilitate the removal of the micro devices from a carrier substrate and/or placement of the micro devices on a receiving substrate, as described further below.

As described above, the articulating transfer head assembly 106, or a portion thereof, may be coupled to surrounding structures of the mass transfer tool 100, such as housing 210, through one or more components of actuator assembly 110. For example, the articulating transfer head assembly 106 can be coupled to housing 210 of the mass transfer tool 100 by a flexure 404. The flexure 404 may be fixed to the articulating transfer head assembly 106 along an inner edge of the flexure. Likewise, the flexure 404 may be fixed to a housing 210 of the mass transfer tool 100 either along an outer edge or through fastener holes. Thus, the articulating transfer head assembly 106 is able to move relative to the housing 210 through deflection of the flexure 404. For example, plate 416, which can define an upper surface of articulating transfer head assembly 106 can move relative to a position sensor 414 mounted on housing 210. Furthermore, as explained below, movement of the transfer head assembly 106 can be constrained in a direction that is orthogonal to the mounting surface 202 since, in at least one embodiment, the mounting surface 202 can be parallel to the flexure surface. However, in some embodiments, the mounting surface 202 can be formed with a non-planar surface. Thus, in at least one embodiment, the flexure 404 can constrain movement of the transfer head assembly 106 in a direction that is orthogonal to an array of contact surfaces 205 (see FIG. 6B) of the array of electrostatic transfer heads 204 which may or may not be parallel to the mounting surface 202.

In an embodiment, a second flexure 404' can be used to further constrain movement of the articulating transfer head assembly 106 in the manner described below. The flexure 404' can include a shape and configuration similar to the flexure 404. Furthermore, the flexure 404' can be coupled to a same or different structure as the flexure 404. In an embodiment, the flexure surface of the flexure 404' can be oriented substantially parallel to a flexure surface of the flexure 404. As a result, the flexure 404 and the flexure 404' can constrain movement of the mounting surface 202 in the same direction.

It will be appreciated that movement of the transfer head assembly 106 can be effected in at least two ways. First, if the articulating transfer head assembly 106 is driven such that the array of electrostatic transfer heads supported by an attached substrate 200 is driven into another object or surface, e.g., an array of micro devices supported on a carrier substrate, the reaction force from the impact will place a biasing load on the mounting surface 202 that can translate into deflection of the flexure 404. Second, the articulating transfer head assembly 106 having the mounting surface 202 can be driven by another actuator component, such as an axial actuator 406 component of the actuator assembly 110. In an embodiment, the axial actuator 406 can include a linear actuator. For example, the axial actuator 406 can include a voice coil actuator. In a voice coil actuator, an electrical current can be passed through a voice coil of the axial actuator 406 to generate a magnetic field that drives a permanent magnet such that the axial actuator extends linearly. It will be appreciated that other actuators, such as linear motors, hydraulic pistons, and other actuators that generate axial motion can be used. In one aspect, the flexure 404 constrains movement of the transfer head assembly 106 along a single direction, such that even actuators that impart significant lateral loads to the transfer head assembly can be used to perform the function of the axial actuator 406.

Figure 5:
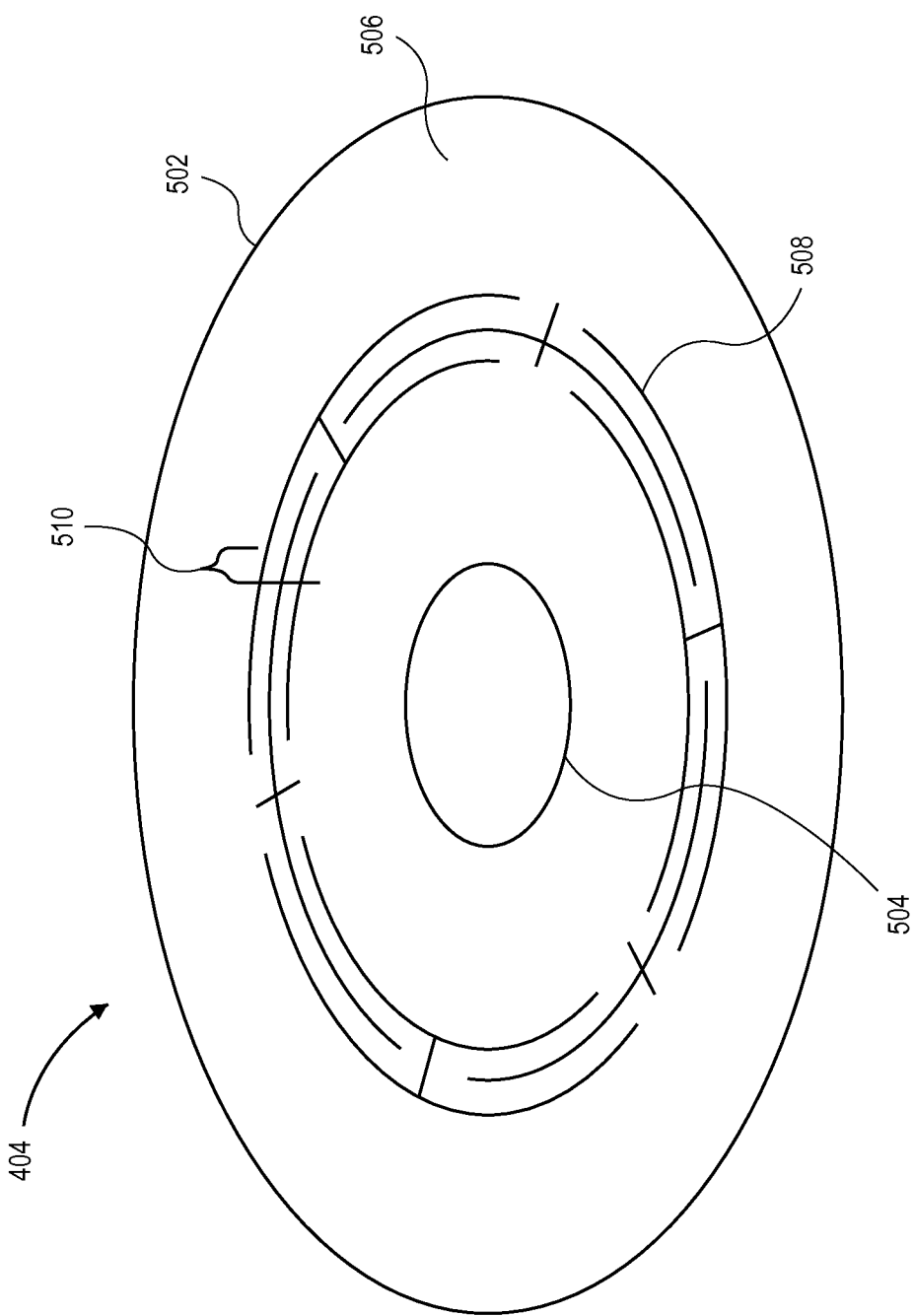
FIG. 5 is a perspective view illustration of a flexure in accordance with an embodiment of the invention.

Referring now to FIG. 5, a perspective view illustration of a flexure is shown in accordance with an embodiment of the invention. In this embodiment, the flexure 404 has a disc configuration, which includes outer edge 502, inner edge 504, and flexure surface 506 therebetween. Along flexure surface 506, one or more slots 508 can be formed to increase the local flexibility of the slotted area. For example, several concentrically formed slots 508 arranged in an annular region between inner edge 504 and outer edge 502 can create flexing surface 510. Flexing surface 510 can constrain flexure deflection in a single direction. More particularly, the flexing surface 510 can constrain motion of the inner edge 504 relative to the outer edge 502 in a direction along an axis that both the inner edge 504 and outer edge 502 are concentrically positioned around.

Figure 6A:
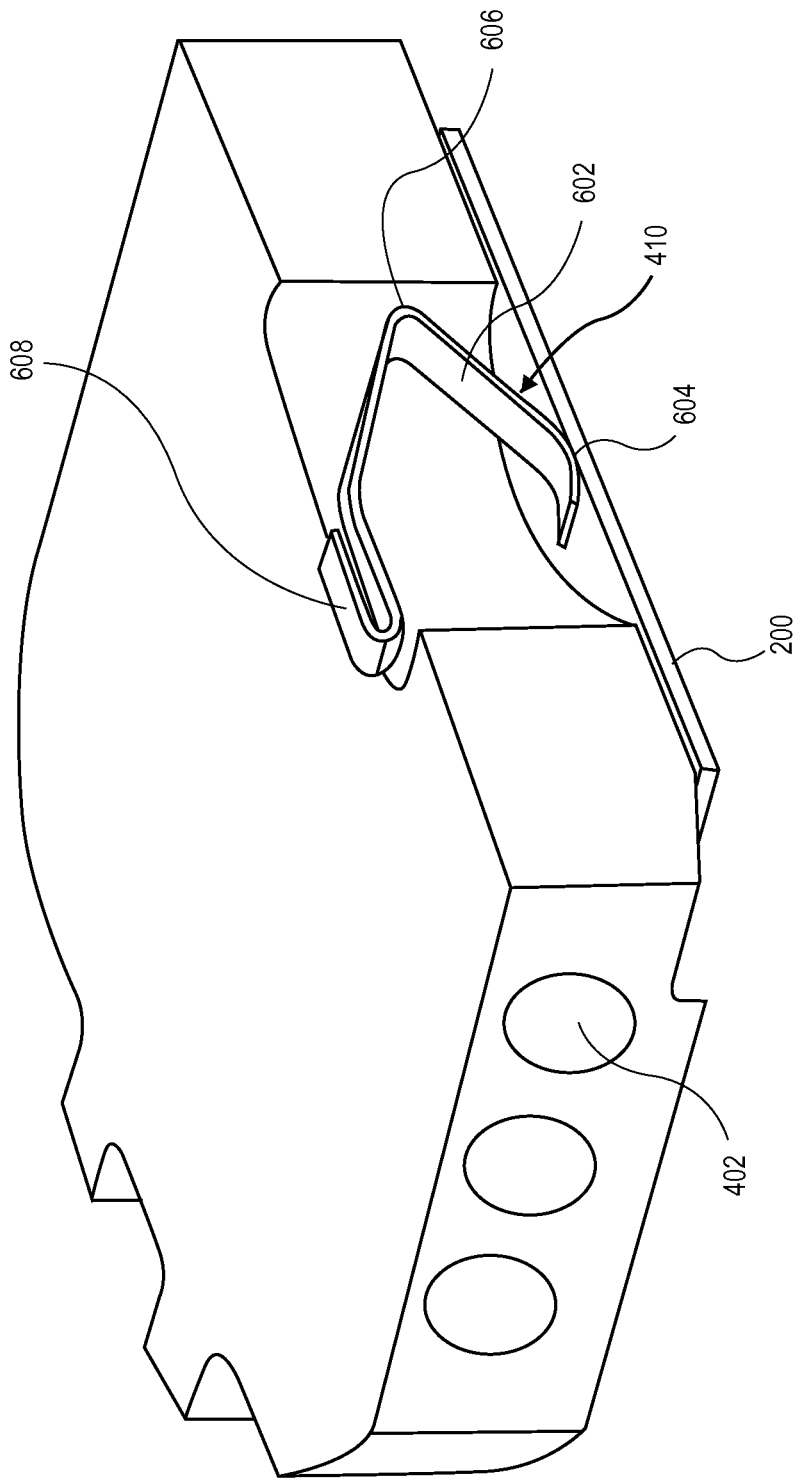
FIG. 6A is a cross-sectional perspective view illustration of a portion of an articulating transfer head assembly of a mass transfer tool having an electrostatic voltage source connection in accordance with an embodiment of the invention.

Referring now to FIG. 6A, a cross-sectional view illustration of a portion of an articulating transfer head assembly portion of a mass transfer tool having an electrostatic voltage source connection is shown in accordance with an embodiment of the invention. The electrostatic voltage source connection 410 can be used to generate an electrostatic force with the array of electrostatic transfer heads 204. In an embodiment, the electrostatic voltage source connection 410 can include a resilient conductor 602 having a contact 604, a knee 606, and a base clip 608. The base clip 608 can attach to wiring of the mass transfer tool 100 to transfer a voltage to the contact 604. The base clip 608 and the contact 604 can be placed at the terminal ends of the resilient conductor 602 and be separated by the knee 606. The knee 606 can provide a flexing surface for the resilient conductor 602. Due to the shape of the knee 606, and the choice of materials used to construct the electrostatic voltage source connection 410, the knee 606 can be resiliently compressed. In other words, the knee 606 can bend when the substrate 200 is attached to the mounting surface 202 and presses on the contact 604. The substrate 200 can be attached to the mounting surface 202 by drawing suction on the substrate 200 through vacuum port 302 formed in the mounting surface 202, as described above, and this suction can provide both the retention force applied to the substrate 200 as well as a compression load on the resilient conductor 602. Thus, the knee 606 bends because the retention force applied to the substrate 200 is transmitted to the resilient conductor 602 at contact 604, generating a load sufficient to cause material deflection and bending in knee 606. Upon removal of the substrate 200, the knee 606 can relax, allowing the contact 604 to extend beyond the mounting surface 202 away from the base clip 608. Thus, the knee 606 stores energy to allow contact 604 to press against substrate 200 with sufficient force to maintain electrical contact during operation of mass transfer tool 100. Resultantly, in at least one embodiment, the knee 606 can also function as an ejection mechanism for removing the substrate 200 when suction is removed by discontinuing vacuum through vacuum port 302.

It will be appreciated that the knee 606 represents only one manner of providing a resilient structure to ensure that the resilient conductor 602 contacts the substrate 200 appropriately. Other potential shapes that provide a resilient structure include helical, arcuate, zigzag and other shapes conducive to elastic deformation of the overall structure. Furthermore, other structures, such as spring loaded contact pins, can be used in place of a resilient structure to ensure that adequate electrical contact is made between the electrostatic voltage source connection and the substrate.

In an embodiment, the electrostatic voltage source connection 410 can be formed in part or in whole from an electrically conductive material. For example, the electrostatic voltage source connection 410 can be formed from a beryllium copper alloy. The material may be stamped, bent, wound or otherwise processed to create a resilient structure for the resilient conductor 602.

Figure 6B:
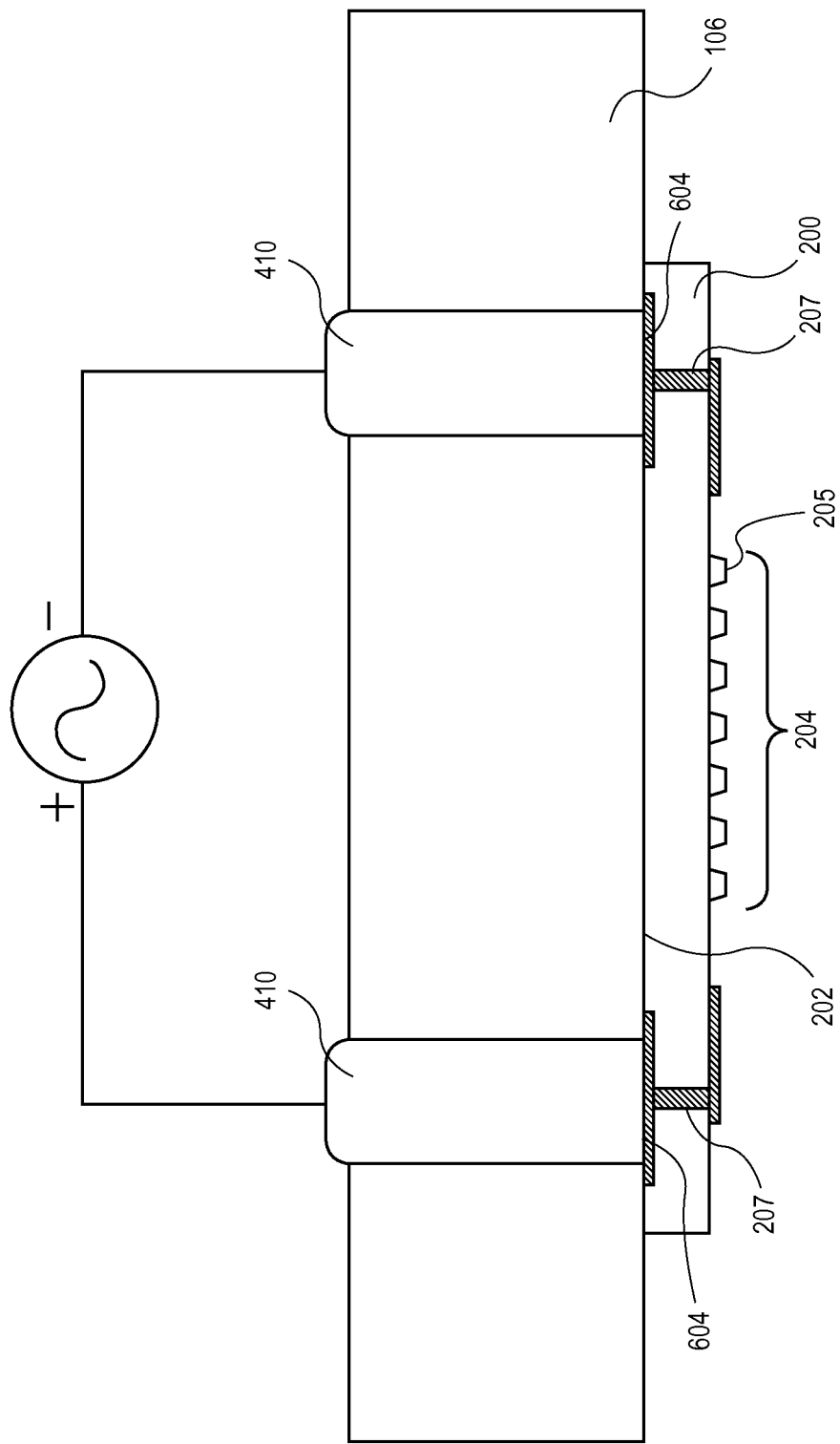
FIG. 6B is a schematic side view illustration of a substrate supporting an array of electrostatic transfer heads attached to the mounting surface and electrically connected with one or more electrostatic voltage source connections in accordance with an embodiment of the invention.

FIG. 6B is a schematic side view illustration of a substrate 200 supporting an array of electrostatic transfer heads 204 attached to the mounting surface 202 and electrically connected with one or more electrostatic voltage source connections 410 in accordance with an embodiment of the invention. The voltage source connections 410 may be connected to a single voltage source or separate voltage sources. The one or more voltage source can apply a constant current voltage, or alternating current voltage. In an embodiment, an alternating current voltage is applied to a bipolar electrode structure in each electrostatic transfer head. As illustrated, the electrical coupling of the one or more electrostatic voltage source connections 410 to the array of electrostatic transfer heads 204 can be made, for example, through a via structure 207 or wiring that leads from the point of contact 604 through the substrate 200 to the array of electrostatic transfer heads 204. Alternatively, electrical coupling can be made with wiring that leads from the point of contact 604 and over the substrate 200 to the array of electrostatic transfer heads 204.

Figure 7:
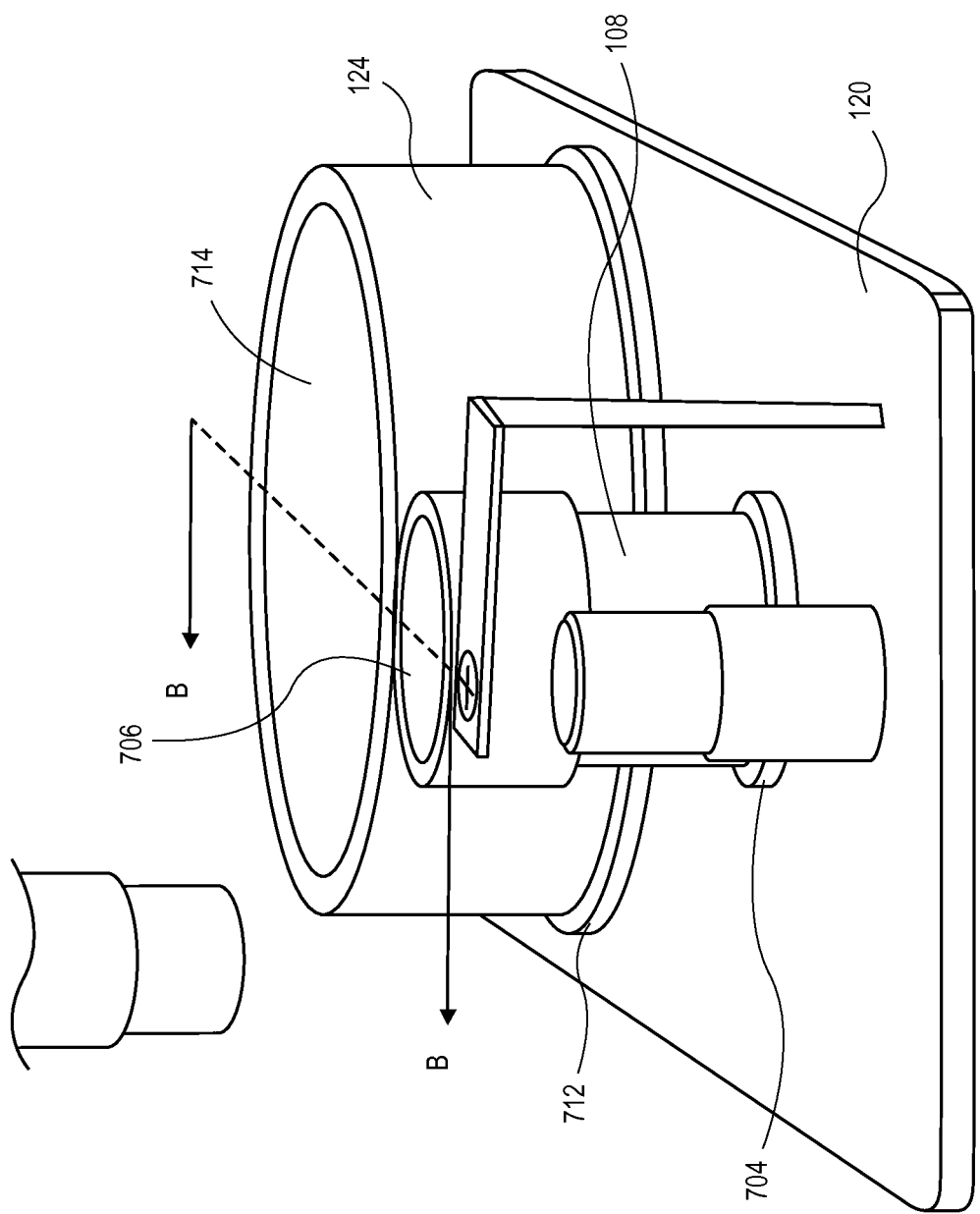
FIG. 7 is a perspective view illustration of a lower assembly portion of a mass transfer tool having a carrier substrate holder and a receiving substrate holder in accordance with an embodiment of the invention.

Referring now to FIG. 7, a top perspective view illustration of a lower assembly portion of a mass transfer tool having a carrier substrate holder and a receiving substrate holder is shown in accordance with an embodiment of the invention. The lower assembly 104 portion includes a carrier substrate holder 108 that is coupled with a carriage 120 of the mass transfer tool 100 and can be configured to hold a carrier substrate 706 supporting an array of micro devices. In one embodiment, the carrier substrate 706 rests within a recess of the carrier substrate holder 108. For example, the carrier substrate holder 108 may include a counterbore formed in an upper surface, the counterbore having a profile that conforms with, and is slightly larger than, the profile of the carrier substrate 706.

In an alternative embodiment, the carrier substrate 706 can be actively held within the carrier substrate holder 108. For example, the carrier substrate 706 can rest on a holding surface, as described further below that includes a vacuum port coupled with a vacuum source. Suction can be applied to the carrier substrate 706 by the vacuum port when the carrier substrate 706 is placed over the holding surface. It will be appreciated that alternative methods of actively holding the carrier substrate 706 may be contemplated within the scope of this disclosure. For example, the carrier substrate holder 108 may include a chuck, such as a mechanical vise, having grippers that press against a surface of the carrier substrate 706 to retain the carrier substrate 706 within the carrier substrate holder 108. Each of these alternative embodiments can serve a function of retaining and stabilizing the position of the carrier substrate 706 within the carrier substrate holder 108.

In an embodiment, there is a force gauge 704 coupled with the carrier substrate holder 108. For example, the carrier substrate holder 108 may be fastened to a plate of the force gauge 704 using various fasteners. As a result, the force gauge 704 can measure a force applied to the carrier substrate holder 108. When no load is applied to the carrier substrate holder 108, the force gauge 704 may measure the weight of the carrier substrate holder 108. When a carrier substrate 706 is placed on the carrier substrate holder 108, the force gauge 704 may then measure the cumulative weight of the carrier substrate 706 and the carrier substrate holder 108. Furthermore, if an additional force were applied, such as if the array of electrostatic transfer heads 204 of the articulating transfer head assembly 106 were driven into the carrier substrate 706 by the axial actuator 406, then the force gauge 704 may measure the cumulative weight and the force applied to the carrier substrate holder 108 by the articulating transfer head assembly 106. It will be appreciated that force gauges of various specifications can be used within the scope of this disclosure, but in at least one embodiment, the force gauge 704 can measure with at least a microgram resolution.

It will be appreciated that the carrier substrate holder 108 can include additional features within the scope of this description. For example, the carrier substrate holder 108 may include jack screws (not shown) that can be adjusted to tilt a carrier substrate 706 held by the carrier substrate holder 108 or to otherwise adjust the carrier substrate orientation. This and other features will be contemplated by one skilled in the art within the scope of this disclosure.

Still referring to FIG. 7, the lower assembly 104 portion can include a receiving substrate holder 124 that is coupled with the carriage 120 of the mass transfer tool 100. In an embodiment, a receiving substrate 714 rests within a recess of the receiving substrate holder 124. For example, the receiving substrate holder 124 may include a counterbore formed in an upper surface, the counterbore having a profile that conforms with, and is slightly larger than, the profile of the receiving substrate 714.

In an alternative embodiment, the receiving substrate 714 can be actively held within the receiving substrate holder 124. For example, a holding surface, as described further below, may include a vacuum port coupled with a vacuum source. Suction can be applied to the receiving substrate 714 by the vacuum port when the receiving substrate 714 is placed over the holding surface. It will be appreciated that alternative methods of actively holding the receiving substrate may be contemplated within the scope of this disclosure. For example, the receiving substrate holder 124 may include a chuck, such as a mechanical vise, having grippers that press against a surface of the receiving substrate to retain the receiving substrate 714 within the receiving substrate holder 124. Each of these alternative embodiments can serve a function of retaining and stabilizing the position of the receiving substrate 714 within the receiving substrate holder 124.

In an embodiment, there is a force gauge 712 coupled with the receiving substrate holder 124. For example, the receiving substrate holder 124 may be fastened to a plate of the force gauge 712 using various fasteners. As a result, the force gauge 712 can measure a force applied to the receiving substrate holder 124. When no load is applied to the receiving substrate holder 124, the force gauge 712 may measure the weight of the receiving substrate holder 124. Thus, when a receiving substrate 714 is placed on the receiving substrate holder 124, the force gauge 712 may then measure the cumulative weight of the receiving substrate 714 and the receiving substrate holder 124. Furthermore, if an additional force were applied, such as if the array of electrostatic transfer heads 204 of the articulating transfer head assembly 106 were driven into the receiving substrate 714 by an axial actuator 406, then the force gauge may measure the cumulative weight and the force applied to the receiving substrate holder 124 by the articulating transfer head assembly 106. It will be appreciated that force gauges of various specifications can be used within the scope of this disclosure, but in at least one embodiment, the force gauge 712 can measure with at least a microgram resolution.

It will be appreciated that the receiving substrate holder 124 can include additional features within the scope of this description. For example, the receiving substrate holder 124 may include jack screws (not shown) that can be adjusted to tilt a receiving substrate 714 held by the receiving substrate holder 124 or to otherwise adjust the receiving substrate orientation. This and other features will be contemplated by one skilled in the art within the scope of this disclosure.

Figure 8:
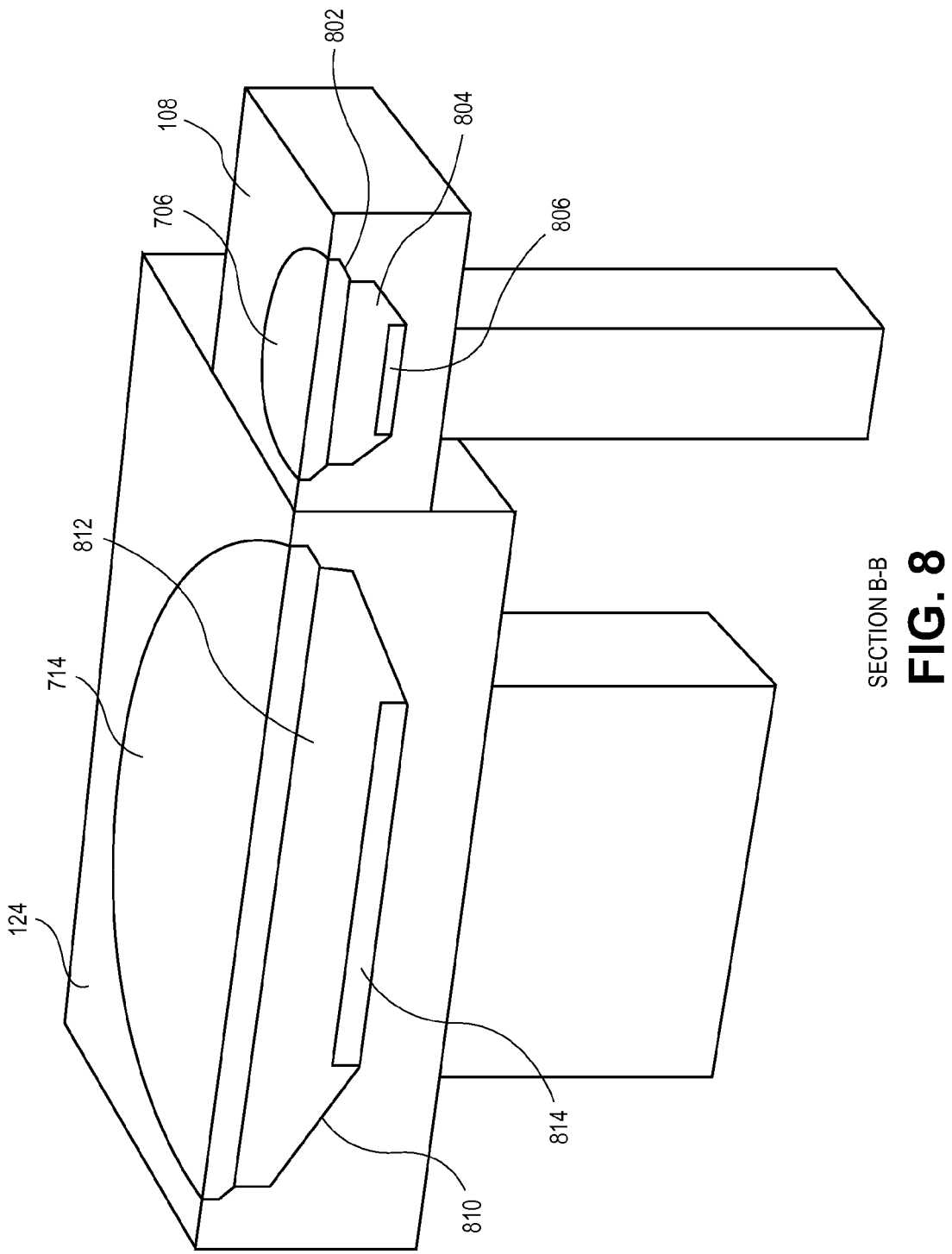
FIG. 8 is a cross-sectional perspective view illustration taken about line B-B of FIG. 7 of a lower assembly portion of a mass transfer tool having a carrier substrate holder and a receiving substrate holder in accordance with an embodiment of the invention.

Referring now to FIG. 8, a cross-sectional perspective view illustration taken about line B-B of FIG. 7 of a lower assembly portion of a mass transfer tool having a carrier substrate holder and a receiving substrate holder is shown in accordance with an embodiment of the invention. In an embodiment, the carrier substrate holder 108 receives the carrier substrate 706 on a holding surface 802. The holding surface 802 can be a chamfer, or it may be another shape or combination of shapes. For example, the holding surface 802 can be a flat surface. Furthermore, as described above, the holding surface 802 can include a vacuum port (not shown) to apply a vacuum that actively holds the carrier substrate 706.

When held by the carrier substrate holder 108, the carrier substrate 706 can be apposed with a heat distribution plate 804. The heat distribution plate 804 may be formed, for example, from a metal such as aluminum or silicon carbide, for thermal conduction. Thus, heat can be transferred readily from a heater 806 to the carrier substrate 706 through the heat distribution plate 804 to facilitate the transfer of micro devices from carrier substrate 706 to the array of electrostatic transfer heads 204. The heater 806 can be a heating element having a number of different configurations. For example, the heater 806 can be an electric disc heater. Alternatively, the heater 806 can be a radiant heater. In an embodiment, heat transferred from the heater 806 to the carrier substrate 706 can increase the temperature of the carrier substrate 706 to a temperature range of about 100 to 200 degrees Celsius. In another embodiment, the temperature of the carrier substrate 706 can increase to a temperature range of about 140 to 180 degrees Celsius. In yet another embodiment, the temperature of the receiving substrate 714 can increase to a temperature of about 150 degrees Celsius.

In an embodiment, the receiving substrate holder 124 receives the receiving substrate 714 on a holding surface 810. The holding surface 810 can be a chamfer, or it may be another shape or combination of shapes. For example, the holding surface 810 can be a flat surface. Furthermore, as described above, the holding surface 810 can include a vacuum port (not shown) to apply a vacuum that actively holds the carrier substrate 706.

When held by the receiving substrate holder 124, the receiving substrate 714 can be apposed with a heat distribution plate 812. The heat distribution plate 812 may be formed, for example, from a metal such as aluminum or silicon carbide, which has good thermal conductivity properties. Thus, heat can be transferred readily from a heater 814 to the receiving substrate 714 to facilitate the transfer of micro devices from the array of electrostatic transfer heads 204 to the receiving substrate 714. The heater 814 can be a heating element having a number of different configurations. For example, the heater 814 can be an electric disc heater. Alternatively, the heater 814 can be a radiant heater. In an embodiment, the heat transferred from the heater 814 to the receiving substrate 714 can increase the temperature of the receiving substrate 714 to a temperature range of between room temperature and about 250 degrees Celsius. In another embodiment, the temperature of the receiving substrate 714 can increase to a temperature range of about 100 to 200 degrees Celsius. In another embodiment, the temperature of the receiving substrate 714 can increase to a temperature of about 150 degrees Celsius.

In light of the description above, it will be apparent that in order to transfer an array of micro devices from a carrier substrate 706 held by the carrier substrate holder 108 to a receiving substrate 714 held by the receiving substrate holder 124 using an array of electrostatic transfer heads 204 supported by a substrate 200 attached to an articulating transfer head assembly 106, the articulating transfer head assembly 106 can be moved relative to the substrate holders. More particularly, the relative motion and spatial relationship between various mass transfer tool 100 components can be adjusted to facilitate transfer of the array of micro devices. More specifically, a spatial relationship between articulating transfer head assembly 106 and carrier substrate holder 108 can be adjusted with six degrees of freedom, allowing for complete articulation in space between those components and any components fixed or coupled thereto. The spatial relationship adjustments can be made by various actuator assembly 110 components.

As discussed above, the lower assembly 104 can include actuator assembly 110 components coupled with the carrier substrate holder 108 to adjust the carrier substrate holder 108 relative to a reference point, such as gantry 113, base 114, or side beam 116. For example, the lower assembly 104 can include actuator assembly 110 components having actuators that move linearly along two axes. These actuators can be an x-y stage 112 coupled with carriage 120, such that a carrier substrate 200 held by a carrier substrate holder 108 mounted on the carriage 120 can be translated in a single plane with complete control in two degrees of freedom. The stages can thus impart translational motion to the carriage and components coupled with the carriage. Such an actuator would alone allow for adjustment between the array of electrostatic transfer heads 204 and the carrier substrate 706 in two degrees of freedom.

Figure 9:
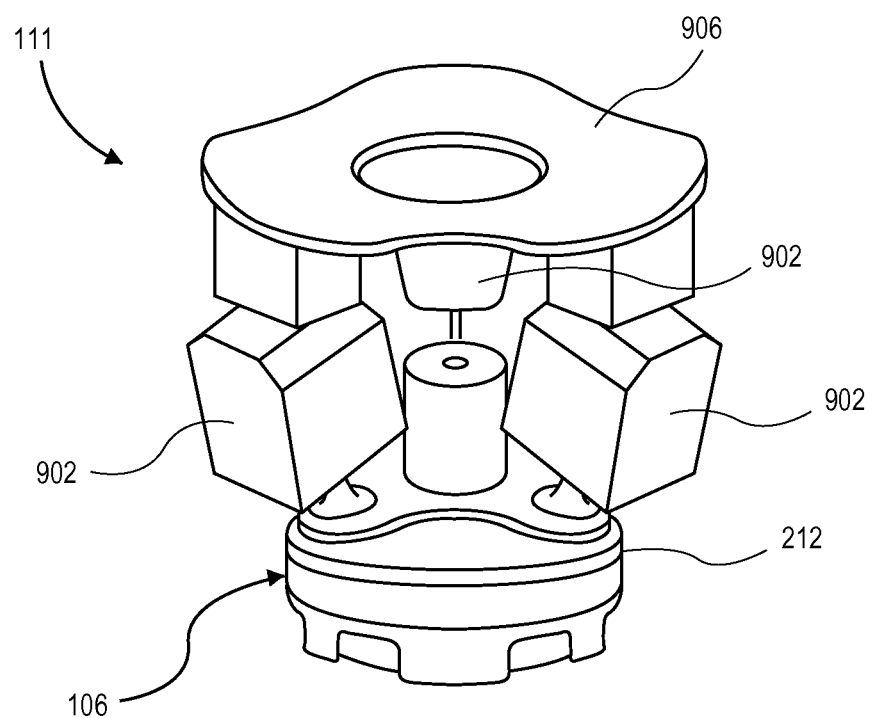
FIG. 9 is a perspective view illustration of an upper assembly portion of a mass transfer tool having a tripod actuator in accordance with an embodiment of the invention.

Referring now to FIG. 9, a perspective view illustration of an upper assembly portion of a mass transfer tool having a tripod actuator is shown in accordance with an embodiment of the invention. In an embodiment, the upper assembly 102 can include actuator assembly 110 components coupled with the articulating transfer head assembly 106 to adjust the articulating transfer head assembly 106 relative to a reference point, such as gantry 113, base 114, or side beam 116. The upper assembly 102 portion can include one or more actuators that provide at least one axis of freedom. For example, the actuators may be part of a tripod actuator 111 having three linear actuators 902. In the case of three linear actuators, each linear actuator 902 can be retracted or extended alone to cause a rotation of the mounting plate 212 about an axis relative to the base plate 906. Similarly, all actuators 902 can be moved in tandem to cause linear motion of the mounting plate 212 along an axis orthogonal to the base plate 906.

It will be appreciated that with additional axes of linear motion, the mounting plate 212 can be moved not only in a tip, tilt, extend, or retract direction relative to the base plate 906. For example, in the case of a hexapod actuator with six linear actuators (not shown), rotational motion can be achieved to rotate the mounting plate 212 about an axis orthogonal to the base plate 906. Of course, this rotational motion can also be achieved by the addition of a rotational actuator (not shown), such as a stepper motor, between the base plate 906 and another portion of the mass transfer tool 100. Therefore, one skilled in the art will appreciate that any number of actuators can be added to increase the degrees of freedom between the mounting plate 212 and the base plate 906.

The linear actuators 902 can include linear motors, hydraulic pistons, and other actuators that can generate linear motion. One skilled in the art will appreciate that an axis of freedom provides a degree of freedom, since movement of a point along the axis can be defined in terms of its position on the axis, i.e., its axial position has a single degree of freedom. The linear actuators 902 can also include an end to couple with a mounting plate 212 and an end to couple with a base plate 906. The base plate 906 can be used to fix the tripod actuator 111 to a gantry 113 via bracket 118, thereby creating a reference point for movement of the mounting plate 212. The linear actuators 902 may be coupled with the plates through fasteners, hinges, or other linkages. Thus, actuation of the linear actuators 902 along their respective axes produces a change in a relative position between a point on the mounting plate 212 and a point on the base plate 906. In this way, each linear actuator 902 provides at least one degree of freedom to the mounting plate 212, relative to the base plate 906. As described above, the articulating transfer head assembly 106 can be fixed to mounting plate 212, and thus, tripod actuator 111 can be used to move the articulating transfer head assembly 106 relative to the base plate 906, the gantry 113, or other system components.

It will be appreciated that the actuator assembly 110 can include actuators different from those described above, within the scope of this disclosure. For example, the description above has referred to passive actuators, e.g., flexure 404, as well as active actuators, e.g., tripod actuator 111, axial actuator 406, and x-y stage 112. However, one skilled in the art will understand that other actuators can be included in the actuator assembly 110 to provide additional control over a spatial relationship between the articulating transfer head assembly 106 and the carrier substrate holder 108. By way of example and not limitation, the actuator assembly 110 may include: electrical motors, pneumatic actuators, hydraulic pistons, relays, comb drives, piezoelectric actuators, and thermal bimorphs.

From the preceding description, it will be understood that movement between the system components, and more specifically, movement between the articulating transfer head assembly 106 and the carrier substrate holder 108 and receiving substrate holder 124 can be provided by actuator assembly 110. The precise motion provided by the actuator assembly 110 can be controlled by a computer system 150 based on feedback inputs from various sensors throughout the mass transfer tool 100. These various sensors and their mode of operation will be discussed further below.

Figure 10:
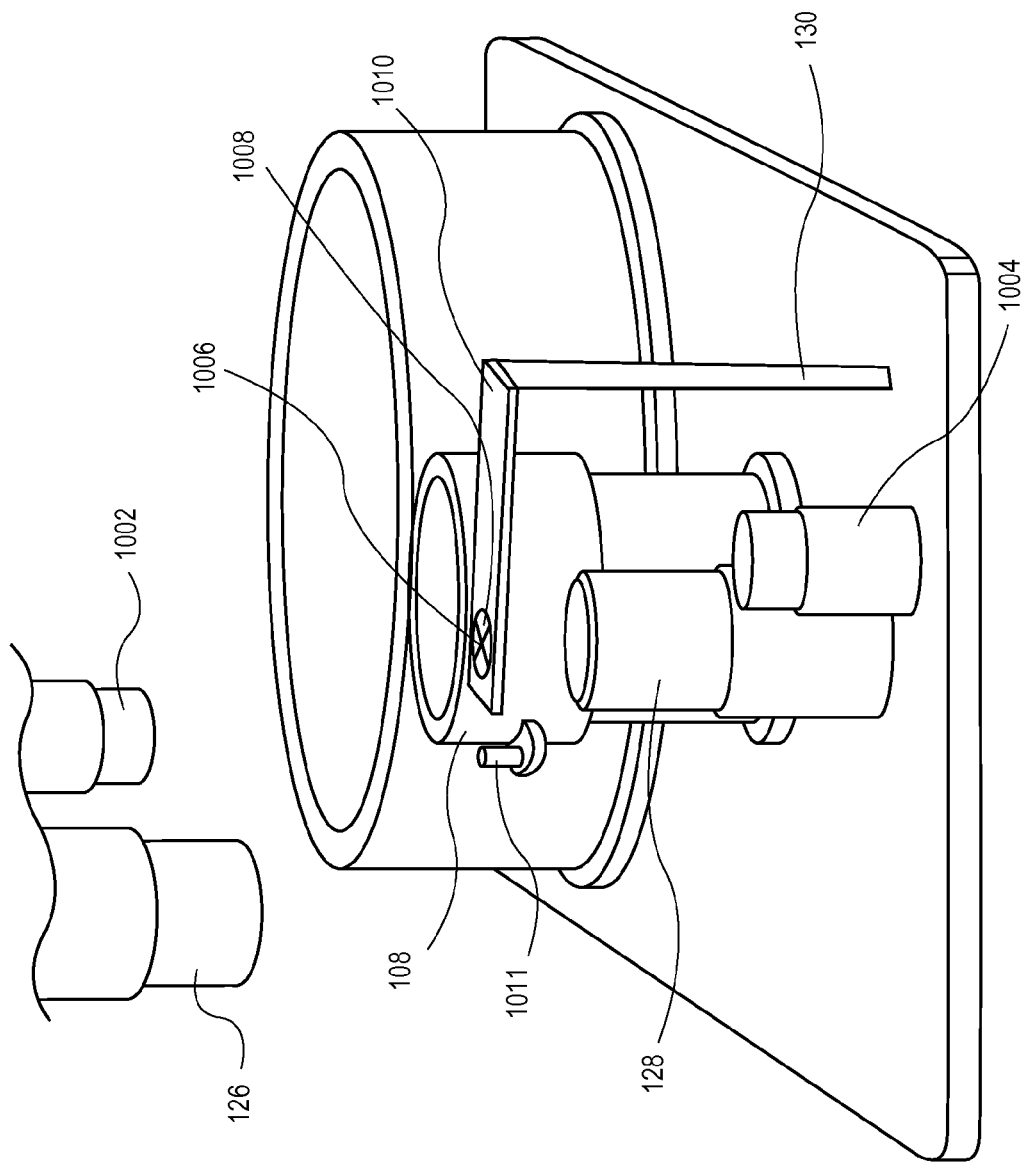
FIG. 10 is a perspective view illustration of a lower assembly portion of a mass transfer tool having sensors in accordance with an embodiment of the invention.

Referring now to FIG. 10, a perspective view illustration of a lower assembly portion of a mass transfer tool having sensors is shown in accordance with an embodiment of the invention. The mass transfer tool can include one or more imaging devices 126, 128. For example, an imaging device 126 can be coupled with upper assembly 102 and located near articulating transfer head assembly 106. In an embodiment, imaging device 126 can be fixed relative to articulating transfer head assembly 106. In addition, an imaging device 128 can be coupled to the lower assembly 104 and located near the carrier substrate holder 108. In an embodiment, imaging device 128 can be fixed relative to the carrier substrate holder 108. Thus, in an embodiment, movement of either imaging device to view a new location of interest results in a corresponding movement of the related articulating transfer head assembly 106 or carrier substrate holder 108. In this way, relative motion between the articulating transfer head assembly 106 and carrier substrate holder 108 can be determined based on movements of imaging devices 126, 128.

The imaging device 128 can include a camera having sufficient resolution and range of focus to view a single electrostatic transfer head in an array of electrostatic transfer heads 204 supported by substrate 200. For example, the camera can have an image resolution allowing dimensions of less than one micrometer to be resolved. The imaging device 126 can include a camera having sufficient resolution and range of focus to view a single micro device supported by carrier substrate 704.

In an alternative embodiment, there may be multiple imaging devices located on each of the upper and lower assemblies 102, 104. For example, each subassembly can include a high magnification camera 126, 128 and a low magnification camera 1002, 1004. By way of example and not limitation, the low magnification cameras 1102, 1004 may be used to provide feedback inputs to computer system 150 for controlling gross adjustments and movements of the actuator assembly 110, while the high magnification cameras 126, 128 may be used to provide feedback inputs to computer system 150 for controlling fine adjustments and movements of the actuator assembly 110.

It will be appreciated that imaging devices 126, 128 represent only one alternative for providing feedback related to the position of the upper and lower subassemblies 102, 104 or components attached thereto. Other devices can be contemplated within the scope of this disclosure. For example, rather than utilizing imaging devices, the mass transfer tool 100 may include capacitive proximity sensors for aligning the articulating transfer head assembly 106 and carrier substrate holder 108. Other alternatives will be apparent from the following discussion regarding the functionality of the mass transfer tool 100.

The imaging devices 126, 128 can facilitate identifying features and locations of interest on system components, e.g., reference marks 206 on substrate 200, in order to generate data that can be used to establish reference points for the actuator assembly 110 and to control motion of the actuator assembly 110. In an embodiment, to facilitate establishing a reference point between imaging devices 126, 128, the mass transfer tool 100 can include an alignment tool 130. In an embodiment, the alignment tool includes a fiducial mark 1006. For example, the fiducial mark 1006 can be a part of a transparent plate 1008 (e.g., glass) that is supported by an alignment bracket 1010. More particularly, plate 1008 having fiducial mark 1006 can be positioned between an upward-viewing imaging device 128 and a downward-viewing imaging device 126. In an embodiment, the plate 1008 can be positioned between two planes, one plane approximately coinciding with an imaging plane of the upward-viewing imaging device 128 and another plane approximately coinciding with an imaging plane of the downward-viewing imaging device 126. The imaging planes may be defined as being coplanar with a charge-coupled device (CCD) image sensor surface of a digital camera. Thus, the fiducial mark 1006 can be viewed by both the upward-viewing imaging device 128 and the downward-viewing imaging device 126 either simultaneously or at different times.

It will be appreciated that the fiducial mark 1006 can be formed using several different methods. For example, the fiducial mark 1006 can be printed on the plate 1008 using an ink or laser printing process. Alternatively, the fiducial mark 1006 can be etched into the plate 1008, for example, using an acidic etchant such as a fluoride compound. Also, caustic or abrasive etchants can be used to form the fiducial mark 1006.

In an embodiment, the fiducial mark 1006 includes an asymmetric pattern. For example, the fiducial mark 1006 may resemble the upper portion of the number "1", in which there is a bend toward the left away from the upright portion of the numeral, but no bend toward the right. Alternatively, the fiducial mark 1006 could be a cross pattern in which the vertical and horizontal lines cross at a point other than the midline of the lines. Thus, when viewed under high magnification, the fiducial mark 1006 provides information related to its orientation. For example, if the bend of the numeral "1" is known to point toward the front of the mass transfer tool 100, when viewed under a camera, the fiducial mark 1006 would provide information related to the orientation of the image relative to the mass transfer tool orientation.

While imaging sensors 126, 128 can facilitate the recognition of reference marks to establish reference frames and enable the movement of actuator assembly 110 in order to align components as will be described further below, it will be appreciated that additional position sensors can be included in the mass transfer tool 100 to provide feedback relating to the relative position of mass transfer tool components. One such position sensor 208 was already described above. In another embodiment, a position sensor 1011 can be mounted near the carrier substrate holder 108 to provide a feedback input that aids in the adjustment of the actuator assembly 110. For example, the position sensor 1011 can terminate in a distal end that is approximately coplanar with the holding surface 802 (FIG. 8) or a surface of the carrier substrate holder 108. Thus, the position sensor can detect a distance to a surface relative to the carrier substrate holder 108. For example, the position sensor can provide feedback relating to the distance between a carrier substrate 706 held by the carrier substrate holder 108 and a substrate 200 attached to the articulating transfer head assembly 106 when those components are adjusted relative to each other.

Figure 11:
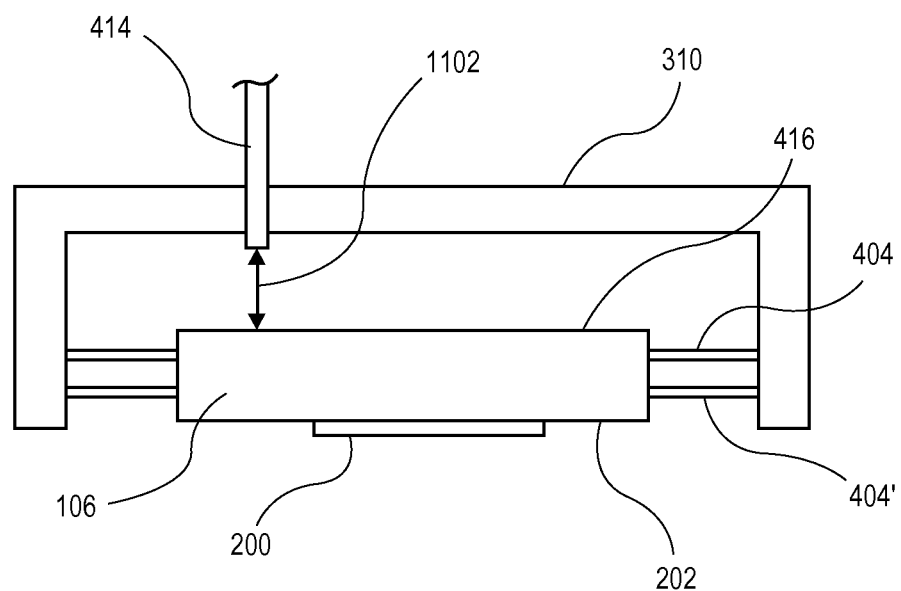
FIG. 11 is a side view schematic illustration of an upper assembly portion of a mass transfer tool having an articulating transfer head assembly in accordance with an embodiment of the invention.

In addition to detecting relative position of system components, various sensors of mass transfer tool can also be used to sense deflection and contact of system components. Referring to FIG. 11, a side view schematic illustration of an upper assembly portion of a mass transfer tool having an articulating transfer head assembly is shown in accordance with an embodiment of the invention. This view provides a schematic representation of the mass transfer tool portion previously shown in FIG. 4 above. A substrate 200 is attached to a mounting surface 202 of an articulating transfer head assembly 106. The articulating transfer head assembly 106 includes a plate 416, coupled to a housing 210 of the mass transfer tool by one or more flexures 404, 404'. It will be appreciated that both portions of the articulating transfer head assembly 106 can move, but the flexures 404, 404' isolate them such that contact with the substrate 200 will cause the moving plate 416 to move while the flexures 404, 404' deflect and dampens any force that is transmitted to housing 210. Thus, plate 416 can move relative to housing 210. Furthermore, a position sensor 414 can be coupled with the housing 210. The position sensor 414 can be fixed relative to the housing 210, such that the detection beam senses the plate 416 and provides feedback related to the change in distance 1102 between the plate and the surrounding portion. When the distance 1102 detected by the position sensor 414 changes, it can be determined that the flexures 404, 404' have deflected, indicating that contact between the substrate 200 and another structure, e.g., the carrier substrate 706 or receiving substrate 714, has been made or removed. In an embodiment, the position sensor 414 can be a spectral-interference laser displacement sensor capable of detecting a 50 nanometer deflection of the flexure 404 or a 50 nanometer relative movement between plate 416 and housing 210.

As described above, in an alternative embodiment, a force gauge 704 (FIG. 7) coupled with the carrier substrate holder 108 can sense loads applied to the carrier substrate holder 108 and provide feedback related to those loads to control the actuator assembly 110. For example, the load applied to the carrier substrate holder 108 will increase when the array of electrostatic transfer heads 204 contacts the carrier substrate 706. This increase in load can be measured by the force gauge 704, and the force gauge 704 can provide a feedback input to computer system 150 to control actuator assembly 110. As described above, the force gauge 704 can, for example, be integrated with a carriage 210 that the carrier substrate holder 108 is mounted on. One skilled in the art will recognize that the force gauge 704 may be mounted in other manners and locations to sense when a load is applied to a carrier substrate 706 held by the carrier substrate holder 108. Likewise, a force gauge 712 coupled with the receiving substrate holder 124 can sense loads applied to the receiving substrate holder 124 and provide feedback related to those loads to control the actuator assembly 110.

Having described some aspects of the components and structure of a mass transfer tool 100, some embodiments of methods of operating the mass transfer tool 100 will be described below. More specifically, a method of aligning mass transfer tool components and methods of transferring micro devices using the mass transfer tool are described. It will be appreciated that the following methods can be performed in combination and in any order within the scope of this description. Furthermore, not all operations need be performed. For example, the transferring method may occur each time a micro device is transferred, whereas the alignment method may be performed less frequently than that.

Furthermore, embodiments of the following methods of operating the mass transfer tool may be performed by processing logic that may include hardware (e.g. circuitry, dedicated logic, programmable logic, microcode, etc.), software (such as instructions run on a processing device) or a combination thereof. In one embodiment, the methods are performed by a mass transfer tool system including a mass transfer tool 100 and computer system 150. Computer system 150 may be external to the mass transfer tool 100 or integrated into the mass transfer tool.

Figure 17:
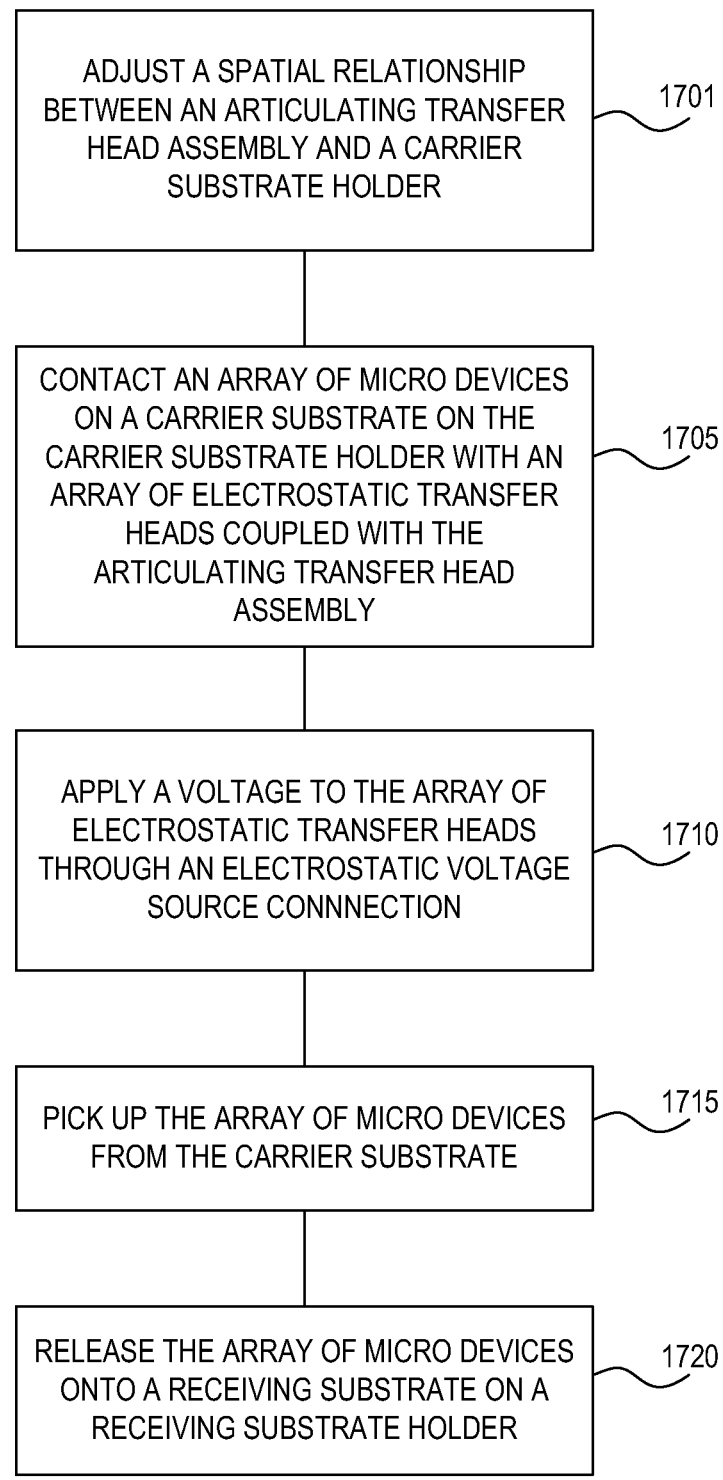
FIG. 17 is a flowchart illustrating a method of operating a mass transfer tool to pick up an array of micro devices shown in accordance with an embodiment of the invention.

Referring now to FIG. 17, a flowchart illustrating a method of operating a mass transfer tool to pick up an array of micro devices is shown in accordance with an embodiment of the invention. For illustrational purposes, the following description of FIG. 17 is also made with reference to the embodiments illustrated in FIGS. 18-19D. At operation 1701 a spatial relationship between articulating transfer head assembly 106 coupled with the substrate 200 and carrier substrate holder 108 holding the carrier substrate 706 can be adjusted. The spatial relationship between the articulating transfer head assembly 106 and a carrier substrate holder 108 can be adjusted with actuator assembly 110. The adjustment of spatial relationship can be effected by the actuation or movement of one or more actuators, such as linear or rotational actuators, that are coupled with the articulating transfer head assembly 106 and carrier substrate holder 108. Furthermore, in this context a spatial relationship can refer not only to a location of the articulating transfer head assembly 106 relative to the carrier substrate holder 108, but also to a position or orientation of the articulating transfer head assembly 106 relative to the carrier substrate holder 108. More particularly, the spatial relationship can be defined by degrees of freedom between mass transfer tool components.

Figure 18:
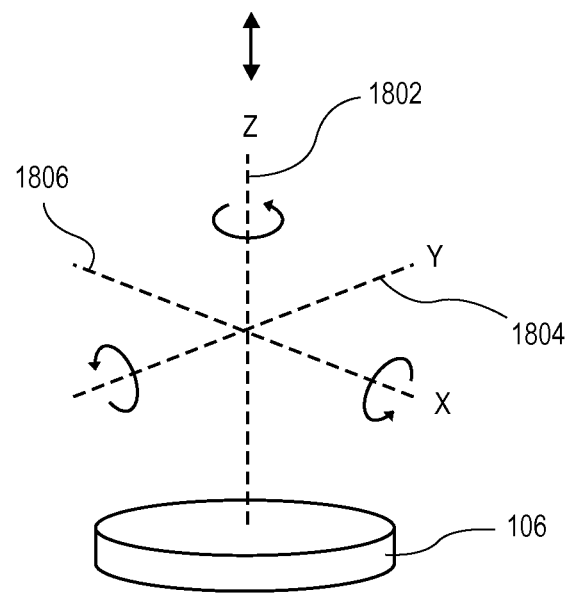
FIG. 18 is a schematic illustration of an adjustment of a spatial relationship between an articulating transfer head assembly and a carrier substrate holder in accordance with an embodiment of the invention.
Figure 18:
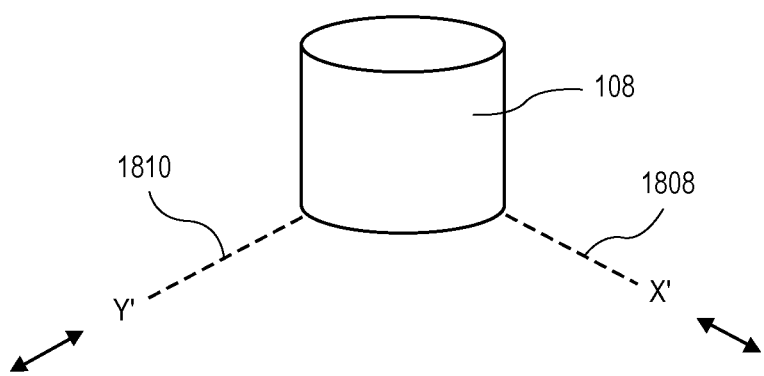

FIG. 18 is a schematic illustration of an adjustment of a spatial relationship between an articulating transfer head assembly and a carrier substrate holder shown in accordance with an embodiment of the invention. This illustrates an aspect of operation 1701 of FIG. 17. The articulating transfer head assembly 106 is shown as being movable in four degrees of freedom. More specifically, the articulating transfer head assembly 106 can move linearly on a z-axis 1802, or it can rotate in x-rotation, y-rotation, or z-rotation, about the x-axis 1804, y-axis 1806, and z-axis 1802. Similarly, the carrier substrate holder 108 is shown as being movable in two degrees of freedom. More specifically, the carrier substrate holder 108 can move linearly along an x'-axis 1808 and a y'-axis 1810. In at least one embodiment, the x-axis can be aligned with the x'-axis and the y-axis can be aligned with the y'-axis. Thus, a spatial relationship between the articulating transfer head assembly 106 and the carrier substrate holder 108 is shown as having six degrees of freedom, given that the relative position between the articulating transfer head assembly 106 and the carrier substrate holder 108 can be described if the position of each component is known within the six degrees of freedom shown. Thus, this spatial relationship can be adjusted by moving either component in their respective degrees of freedom. For example, the carrier substrate holder 108 can be moved in one degree of freedom along the x'-axis 1808 by moving an x-y stage 112 that the carrier substrate holder 108 is attached to. In this manner, the spatial relationship can be adjusted by any of various actuators in an actuator assembly 110 of the mass transfer tool 100. It will be appreciated that the adjustment will adjust a spatial relationship between the articulating transfer head assembly 106 and carrier substrate holder 108, as well as components coupled thereto, such as substrate 200 and carrier substrate 706. Furthermore, while the particular embodiment illustrated in FIG. 18 illustrates four degrees of freedom of the articulating transfer head assembly 106 and two degrees of freedom of the carrier substrate holder 108, it is understood that other configurations are contemplated in accordance with embodiments of the invention for adjusting the spatial relationships between components in at least six degrees of freedom. For example, the articulating transfer head assembly 106 can also be mounted on an x-y stage.

FIG. 19A is a cross-sectional side view illustration of an array of electrostatic transfer heads 204 positioned over an array of micro devices 708 on a carrier substrate 706 after the spatial relationship between the articulating transfer head assembly and the carrier substrate holder has been adjusted, in accordance with an embodiment of the invention. Referring again to FIG. 17, at operation 1705 an array of electrostatic heads 204 supported by the substrate 200 is brought into contact with an array of micro devices on carrier substrate 706. FIG. 19B is a cross-sectional side view illustration of an array of electrostatic transfer heads 204 in contact with an array of micro devices 708 in accordance with an embodiment of the invention. As illustrated, the pitch of the array of electrostatic transfer heads 204 is an integer multiple of the pitch of the array of micro devices 708. Contact can be achieved by moving the articulating transfer head assembly 106 toward the carrier substrate holder 108 using one or more actuators of the actuator assembly 110. It will be appreciated that due to the precise alignment of the substrate 200 and carrier substrate 706, contact is made while the substrate 200 and carrier substrate 706 are oriented substantially parallel to each other. Thus, there is minimal side loading or flexing of the facing surfaces at the point of contact. This is beneficial because it can prevent mismatch between the array of electrostatic heads 204 and one or more micro devices disposed on the carrier substrate surface. It also reduces the risk of damage to the array of electrostatic heads 204 and the one or more micro devices.

Given the small size and structural characteristics of the array of electrostatic transfer heads 204 and micro devices, it may be important to accurately sense when contact has been made between the array of electrostatic transfer heads 204 and the array of micro devices on carrier substrate 706. Contact can be controlled in numerous ways. For example, a drive to contact methodology can be used in which the articulating transfer head assembly 106 is moved toward the carrier substrate 706 by a predetermined distance based on the calculated positional differences between those components. In an embodiment, active feedback control can be used to sense when contact is made and to provide a related signal to control motion of the actuator assembly 110. Various embodiments for sensing contact are described above, such as sensing a deflection of a flexure or a movement the articulating transfer head assembly, and sensing a change in load measured by a force gauge coupled with the carrier substrate holder.

At operation 1710 the array of electrostatic transfer heads 204 can be activated by applying a voltage to the array of electrostatic transfer heads 204 through the electrostatic voltage source connection 410. The voltage can be applied to the electrodes of the electrostatic transfer heads 204 prior to, during, or after contacting the carrier substrate 706. In an embodiment, the voltage can be a constant current or alternating current voltage. Application of voltage creates a grip pressure on the micro devices to enable a pick up of the micro devices. In an embodiment, sufficient grip pressures greater than 1 atmosphere (e.g. 2-20 atmospheres) for micro device pickup can be generated by applying an operating voltage between about 25 V and 300 V.

In an embodiment, heat may optionally be applied to the array of micro devices on the carrier substrate, for example, to create a phase change in a bonding layer holding the array of micro devices to the carrier substrate. For example, heat can be applied from a heater 400 in the articulating transfer head 106 and/or heater 806 connected with to the carrier substrate holder 108.

Still referring to FIG. 17, at operation 1715, the array of micro devices can be picked up from the carrier substrate 706. FIG. 19C is a cross-sectional side view illustration of an array of electrostatic transfer heads picking up an array of micro devices 708 in accordance with an embodiment of the invention. In an embodiment, an actuator, such as an axial actuator 406 is used to move the articulating transfer head assembly 106 away from the carrier substrate 706, thus causing the pick up of the array of micro devices that is gripped by the array of electrostatic transfer heads 204 attached to the mounting surface 202. Alternatively, pick up can be achieved with a passive actuator, such as a flexure 404, which applies a retraction force when another actuator, e.g., an axial actuator 406, is de-energized. In such an embodiment, the de-energization removes an extension force being applied to the articulating transfer head assembly 106, and thus, the articulating transfer head assembly 106 retracts from the carrier substrate surface 806 based on the inherent spring force of flexure 404.

Pick up of the array of micro devices can be sensed in a manner similar to those described above for sensing the making of contact. In an embodiment, a position sensor 414 coupled with an actuator assembly 110 or a housing 210 can detect a deflection of a flexure 404 or a movement of articulating transfer head assembly 106. In an embodiment, a change in load measured by a force gauge coupled with the carrier substrate holder can indicate pick up of the array of micro devices.

FIG. 19D is a cross-sectional side view illustration of an array of micro devices 708 released onto a receiving substrate 714 in accordance with an embodiment of the invention. Prior to releasing the array of micro devices 708 the array of micro devices 708 may be lowered onto the receiving substrate 714 until they contact the receiving substrate. Contact between the receiving substrate 714 and the array of micro devices 708 can be made through actuation of the mass transfer tool. Furthermore, contact can be sensed using position sensors or force gauges, as described above with regard to operation 1705.

Placement of the array of micro devices on a receiving substrate may be performed at an elevated temperature, for example to create a phase change in a bonding layer on the array of micro devices 708 and/or on the receiving substrate 706 or to create a phase change or alloy a bonding layer during placement of the array of micro devices on the receiving substrate.

After the array of micro devices is in contact with the receiving substrate 714, the voltage applied to the array of electrostatic transfer heads 204 through the electrostatic voltage source connection 410 can be removed or altered resulting in the release the array of micro devices onto the receiving substrate 714.

The articulating transfer head assembly 106 can then be moved away from the receiving substrate 714. Removal of the array of electrostatic transfer heads from the array of micro devices can be sensed when moving away from the receiving substrate in a manner similar to those described above for sensing pick up. Furthermore, removal of the array of electrostatic transfer heads from the array of micro devices can be sensed using position sensors or force gauges, as described above with regard to operation 1715.

In an embodiment, an upward-viewing imaging device 128 can be used to inspect an array of electrostatic transfer heads 204 for the presence of micro devices. More particularly, following pick up, the presence of the micro devices can be viewed by the upward-viewing imaging device 128 by moving the articulating transfer head assembly 106 and substrate 200 to a location over the imaging device 128 with an actuator assembly 110. Viewing may be performed under both high and low magnifications, as is known in the art.

Figure 12A:
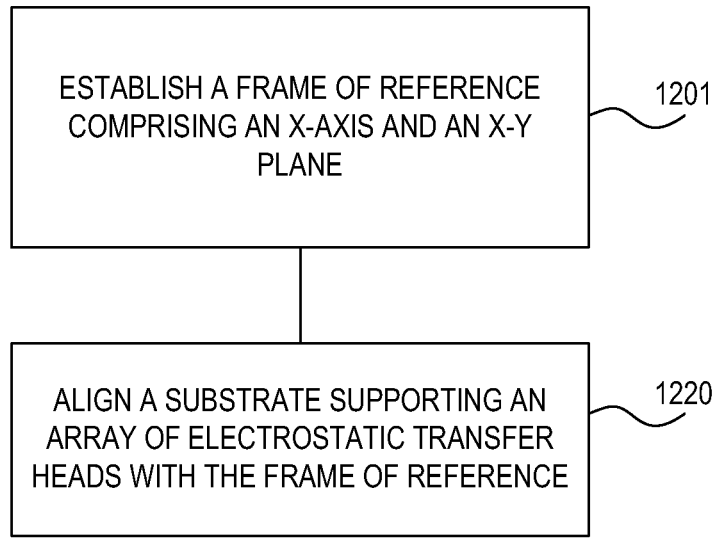
FIG. 12A is a flowchart illustrating a method of aligning a substrate supporting an array of electrostatic transfer heads with a frame of reference in accordance with an embodiment of the invention.

FIG. 12A is a flowchart illustrating a method of aligning a substrate supporting an array of electrostatic transfer heads with a frame of reference in accordance with an embodiment of the invention. At operation 1201, a frame of reference including an x-axis and an x-y plane is established. The frame of reference can be useful for enabling the alignment of various components within the mass transfer tool 100. More specifically, the frame of reference allows for movement of system components relative to reference geometries and to each other. Movement of those components can be monitored and input to a computer system 150 that controls actuator assembly 110. At operation 1220, substrate 200 supporting an array of electrostatic transfer heads 204 is aligned with the established frame of reference using the various sensors of the mass transfer tool 100. In an embodiment, the substrate 200 supporting the array of electrostatic transfer heads 204 is releasably attached to mounting surface 202 of the articulating transfer head assembly 106 and connected to one or more electrostatic voltage source connections 410 prior to aligning the substrate with the frame of reference.

Figure 12B:
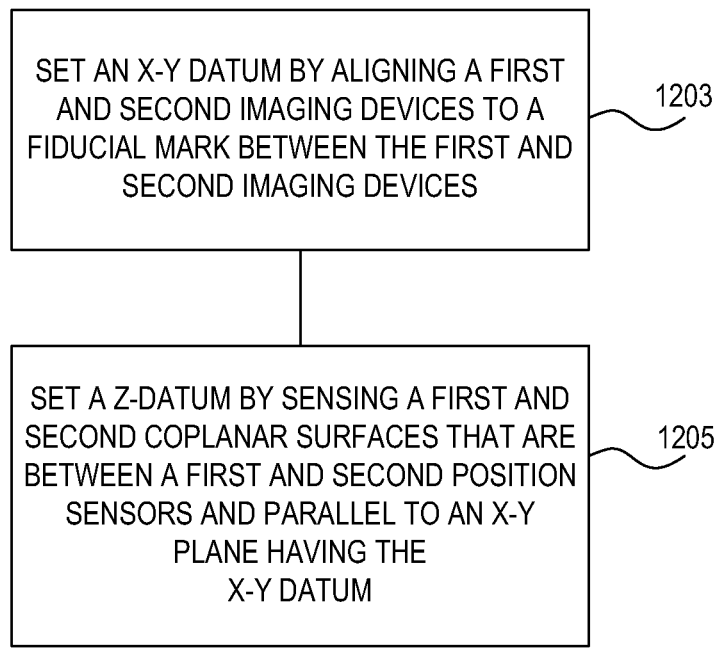
FIG. 12B is a flowchart illustrating a method of establishing a frame of reference in accordance with an embodiment of the invention.

FIG. 12B is a flowchart illustrating a method of establishing a frame of reference in accordance with an embodiment of the invention. At operation 1203, an x-y datum is set by aligning a first and second imaging devices to a fiducial mark between the first and second imaging devices. At operation 1205, a z-datum is set by sending a first and second coplanar surfaces that are between a first and second position sensors and parallel to an x-y plane having the x-y datum. In an embodiment, the x-y datum and the z-datum are used to define the frame of reference.

Figure 12C:
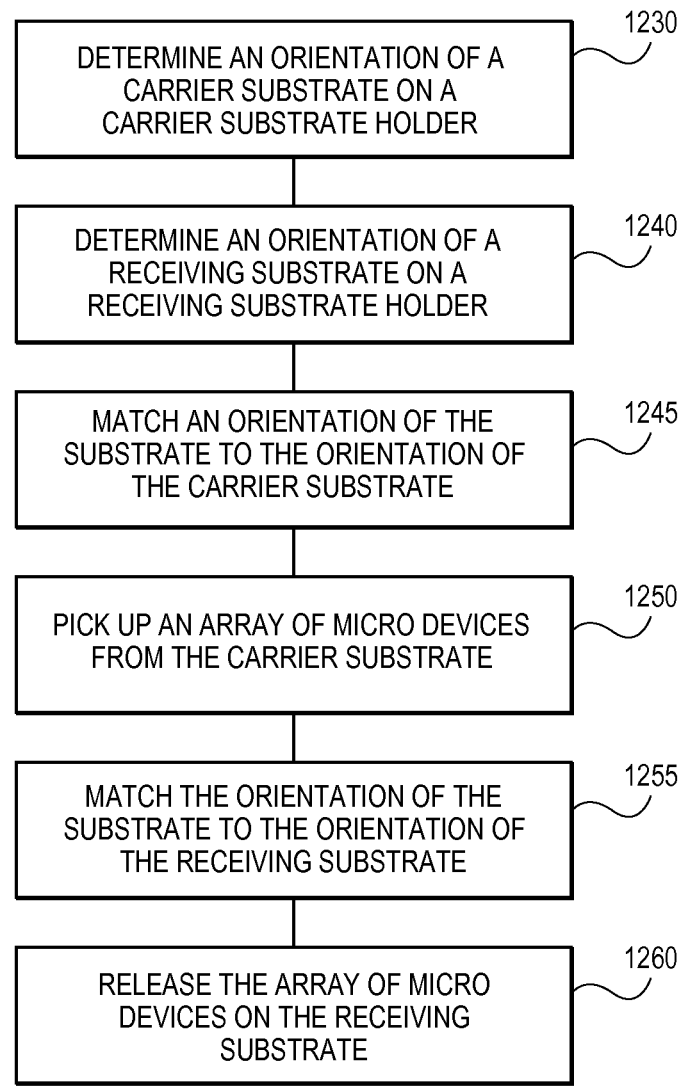
FIG. 12C is a flowchart illustrating a method of operating a mass transfer tool to transfer an array of micro devices shown in accordance with an embodiment of the invention

FIG. 12C is a flowchart illustrating a method of operating a mass transfer tool to transfer an array of micro devices shown in accordance with an embodiment of the invention. At operation 1230, an orientation of a carrier substrate 706 on a carrier substrate holder 108 is determined using the various sensors of the mass transfer tool 100. At operation 1240, an orientation of a receiving substrate 714 on a receiving substrate holder 124 is determined. At operation 1245, an orientation of the substrate 200 is matched to the carrier substrate 706. At operation 1250, the array of micro devices is picked up from the carrier substrate 706. At operation 1255, an orientation of the substrate 200 is matched to the receiving substrate 714. At operation 1260, the array of micro devices is released on the receiving substrate. It will be appreciated that the operations described in FIG. 12C can be sub-divided further or performed in another order.

The following description will provide additional details regarding the operations of the alignment process shown in FIGS. 12A-12B and the transfer process shown in FIG. 12C. The description will occasionally refer back to FIGS. 12A-12C to clarify the specific operation for which additional detail is being provided. However, it will be appreciated that the following details can be applied to alternative methods of alignment and operation within the scope of this description and can be performed independently of the overall method of operations described above.

Figure 13B:
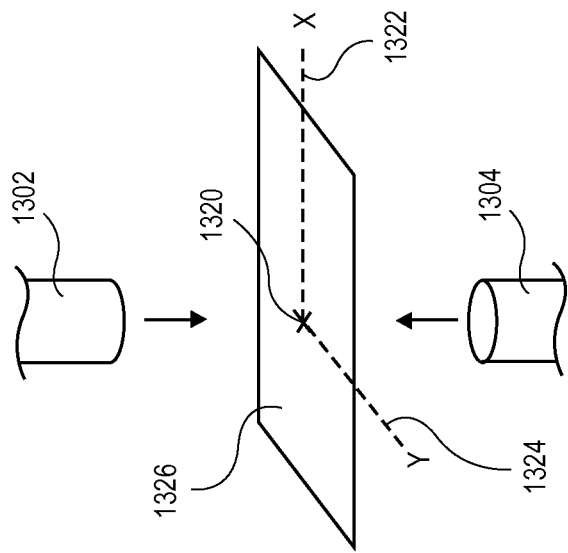
FIG. 13B is a perspective view schematic illustration of a method of setting an x-y datum in accordance with an embodiment of the invention.
Figure 13A:
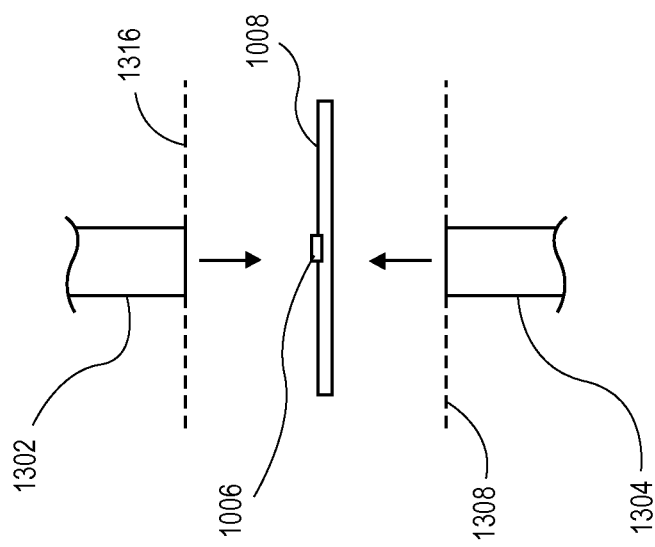
FIG. 13A is a side view schematic illustration of a method of setting an x-y datum in accordance with an embodiment of the invention.

Referring to FIG. 13A, a side view schematic illustration of a method of setting an x-y datum is shown in accordance with an embodiment of the invention. This illustration describes an aspect of operation 1203 of FIG. 12B. The portion of the mass transfer tool shown includes a downward-looking imaging device 1302 and an upward-looking imaging device 1304, both of which can include cameras, for example. A plate 1008 can be disposed between the upward-looking imaging device 1304 and the downward-looking imaging device 1302. More particularly, the plate 1008 can be oriented between an imaging plane 1308 of the upward-looking imaging device 1304 and an imaging plane 1316 of the downward-looking imaging device 1302. As described above, plate 1008 includes a fiducial mark 1006 and the upward-looking imaging device 1304 and the downward-looking imaging device 1302 can be moved to view the fiducial mark 1006 simultaneously by actuation of one or more actuators of an actuator assembly 110.

When the upward-looking imaging device 1304 and the downward-looking imaging device 1302 view the fiducial mark 1006 simultaneously, and the fiducial mark 1006 is centered and focused within the respective images from the imaging devices, the imaging devices will be aligned. Thus, in that position, the fiducial mark 1006 becomes a reference point from which movement of either the upward-looking camera 1304 or the downward-looking camera 1302 can be compared to determine the relative position of the imaging devices in a plane parallel to the imaging planes. In an embodiment, when the upward-looking imaging device 1304 is fixed relative to the carrier substrate holder 108 and the downward-looking imaging device 1302 is fixed relative to the articulating transfer head assembly 106, the fiducial mark 1006 becomes a reference point from which movement of the articulating transfer head assembly 106 or the carrier substrate holder 108 can be compared to determine the relative position of those components in an x-axis and y-axis direction.

Referring to FIG. 13B, a perspective view schematic illustration of a method of setting an x-y datum is shown in accordance with an embodiment of the invention. This illustration also describes an aspect of operation 1203 of FIG. 12B. An upward-looking imaging device 1304 and a downward-looking imaging device 1302 can be moved into position such that they both view a fiducial mark 1006 on plate 1008, as described in regard to FIG. 13A. In FIG. 13B, the fiducial mark 1006 establishes an x-y datum 1320 when centered and focused on simultaneously by the imaging devices 1302, 1304. Furthermore, an x-axis 1322 and a y-axis 1324 are determined to cross through the x-y datum 1320. In an embodiment, the x-axis 1322 and y-axis 1324 correspond with axes of motion of an x-y stage that the upward-looking imaging device is coupled with. Furthermore, the x-axis 1322 and the y-axis 1324 define an x-y plane 1326, which passes through the x-axis 1322, y-axis 1324, and x-y datum 1320. Thus, a frame of reference having an x-axis 1322 and an x-y plane 1326 can be established according to the methods described above. As described above, while some embodiments are described and illustrated as including an x-y stage 112 in the lower assembly 104 only, it is contemplated that the articulating transfer head assembly 106 in the upper assembly 102 can be mounted on an x-y stage in addition to, or alternative to x-y stage 112. In such an embodiment, the x-axis 1322 and y-axis 1324 may correspond with axes of motion of an x-y stage that the downward-looking imaging device is coupled with.

Figure 14A:
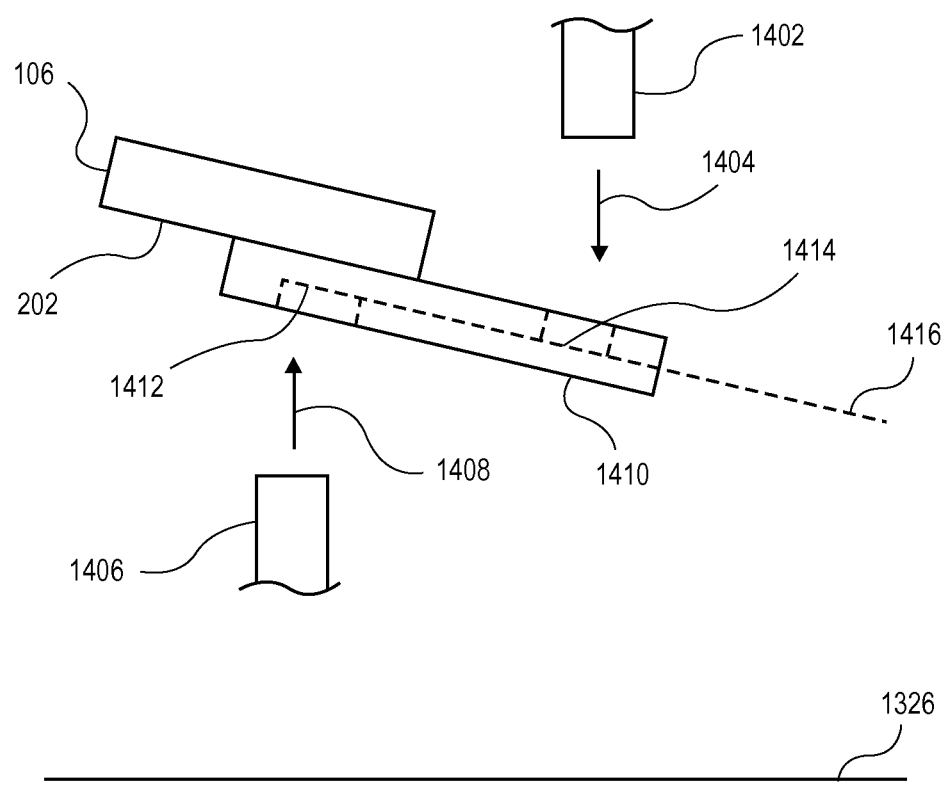
FIG. 14A is a side view illustration of a method of setting a z-datum in accordance with an embodiment of the invention.

Referring to FIG. 14A, a side view illustration of a method of setting a z-datum is shown in accordance with an embodiment of the invention. This illustration describes an aspect of operation 1205 of FIG. 12B. A downward-looking position sensor 1402 is viewing in a downward direction 1404 toward the x-y plane 1326 of the frame of reference. Simultaneously, an upward-looking position sensor 1406 is viewing in an upward direction 1408 opposite to the downward direction. Thus, the directions of the upward and downward-looking position sensors 1402, 1406 are approximately parallel with each other and can be approximately orthogonal to the x-y plane 1326. As described above, the position sensors can be spectral-interference laser displacement sensors capable of determining absolute distance to an object.

A gauge 1410 can be releasably attached to the mounting surface 202 of the articulating transfer head assembly 106 and positioned between the upward and downward-looking position sensors 1402, 1406. The gauge 1410 can be referred to as a "z-gauge" because it is used to establish a z-datum in a frame of reference. Attachment of the z-gauge 1410 can be achieved in a manner similar to the attachment of a substrate 200 to the mounting surface 202. For example, suction can be drawn on the z-gauge 1410 through a vacuum port of the mounting surface 202.

As shown in FIG. 14A, when the z-gauge 1410 is not parallel with the x-y plane 1326, i.e., when the z-gauge 1410 is tilted within the frame of reference, the upward-looking position sensor 1406 can sense a distance to a first surface 1412 and the downward-looking position sensor 1402 can sense a distance to a second surface 1414. These surfaces can be, for example, the base of two counterbores, formed in an outer surface of the z-gauge 1410. The counterbored surfaces 1412, 1414 can be made coplanar with each other. In an embodiment, the surfaces are coplanar because the counterbores each extend through half of the thickness of the z-gauge 1410.

In an embodiment, the first surface 1412 and the second surface 1414 are coplanar with a surface plane 1416. For example, in an embodiment, the z-gauge 1410 can be formed from two silicon wafers having through holes. The two silicon wafers are bonded such that the openings to the through holes are adjacent to a surface of the other wafer. Thus, the base of the through-holes will be the surface of the other wafer, and since the wafers are apposed with each other, their bonding surfaces are coplanar. Therefore, the bases of the through holes are also coplanar and can be used as counterbores for the z-gauge 1410. In another embodiment, the first and second surfaces 1412 and 1414 are not coplanar. For example, the surfaces 1412 and 1414 can be separated by a layer of uniform and known thickness.

When the z-gauge 1410 is not parallel with x-y plane 1326, the distances to the first surface 1412 and the second surface 1414 from the respective upward-looking position sensor 1406 and downward-looking position sensor 1402 will be to different locations along a z-axis, since they exist at different points on a non-parallel plane. As a result, there is no common z-datum between the upward-looking position sensor 1406 and the downward looking position sensor 1402.

Thus, either before or after installing the z-gauge 1410, the mounting surface 202 of the articulating head assembly 106 can be made parallel to the x-y plane 1326 to facilitate establishing a z-datum of the frame of reference. To do so, the upward-looking position sensor 1406 can detect a distance to two or more points on the mounting surface 202, the z-gauge 1410, or any other structure that is known to be parallel to the mounting surface 202. The articulating transfer head assembly 106 can then be tipped and tilted by the actuator assembly 110 until the distances to the various measured points are the same distance from the upward-looking position sensor 1406. When this occurs, the mounting surface 202 can be orthogonal to the direction of detection of the upward-looking position sensor 1406, and thus, the mounting surface 202 is approximately parallel to the x-y plane 1326. Once the mounting surface is oriented parallel to the x-y plane 1326, a z-datum can be established.

Figure 14B:
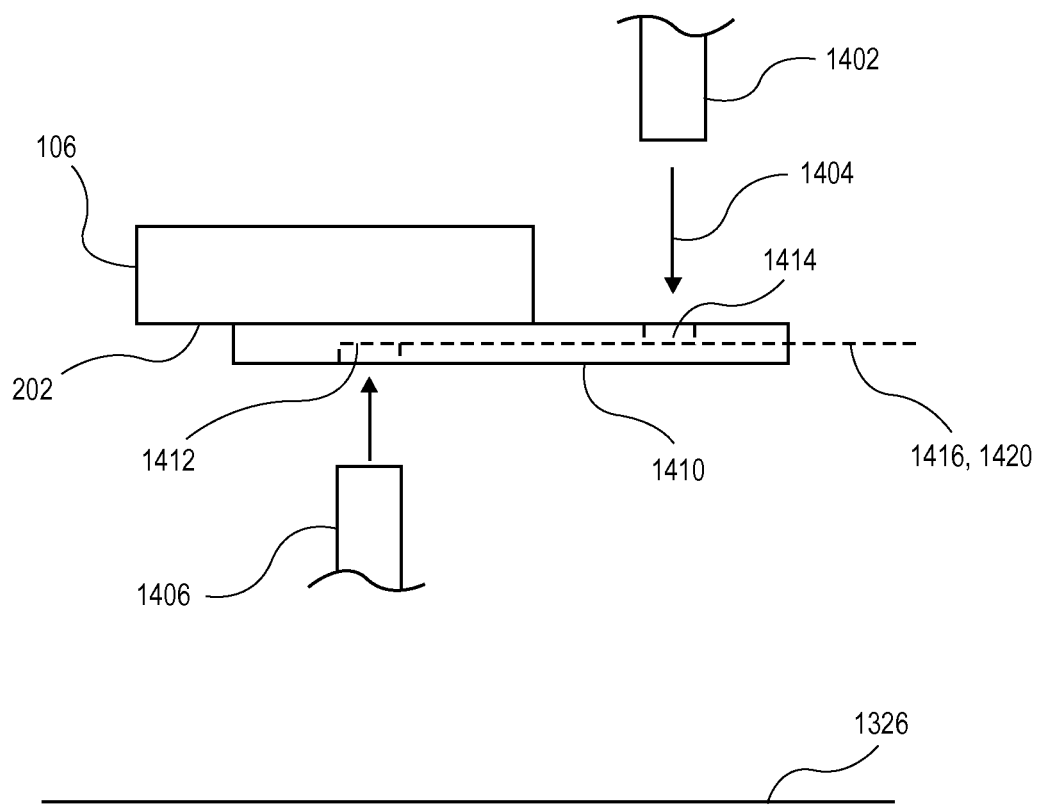
FIG. 14B is a side view illustration of a method of setting a z-datum in accordance with an embodiment of the invention.

Referring to FIG. 14B, a side view illustration of a portion of a mass transfer tool is shown in accordance with an embodiment of the invention. This illustration describes an aspect of operation 1205 of FIG. 12B. Here, the surface plane is known to be parallel to the x-y plane 1326 since either mounting surface 202 or the z-gauge 1410 has been aligned parallel to the x-y plane 1326 by moving the articulating transfer head assembly 106 relative to the upward-looking position sensor 1406, as described above. Thus, the distance to the first surface 1412 from the upward-looking position sensor 1406 and the distance to the second surface 1414 from the downward-looking position sensor 1402 can be registered as the known distance to the surface plane 1416 when the surface plane 1416 is parallel to the x-y plane 1326. Given that the first and second surfaces 1412, 1414 are coplanar, the surface plane 1416 can be established as the z-datum 1420 in this orientation, and the distance to the z-datum 1420 can then be measured using either the upward-looking position sensor 1406 or the downward-looking position sensor 1402.

Once the z-datum 1420 is established, along with the x-axis 1322 and x-y plane 1326, a frame of reference is known for moving components of the mass transfer tool 100. For example, the z-gauge 1410 can now be removed from the mounting surface and replaced by a substrate 200 supporting an array of transfer heads 204. Substrate 200 can be attached to mounting surface 602 of the articulating transfer head assembly 106 using any of the manners described above. In an embodiment, a vacuum is used to hold the substrate 200 on the mounting surface 202 and to compress knee 606 of contact 604 to connect the substrate 200 with the one or more voltage source connections 410. In an embodiment, the z-gauge 1410 can be formed such that the surface plane 1416 is within about 100 micrometers of a location that coincides with a contact surface 205 (FIG. 6B) of the array of electrostatic transfer heads 204 supported by substrate 200. Thus, when the z-gauge 1410 is replaced by the substrate 200, the z-datum 1420 is approximately coincident with the array of electrostatic transfer heads 204, making subsequent adjustments using the upward and downward looking sensors 1402, 1406 substantially easier to perform.

Figure 15A:
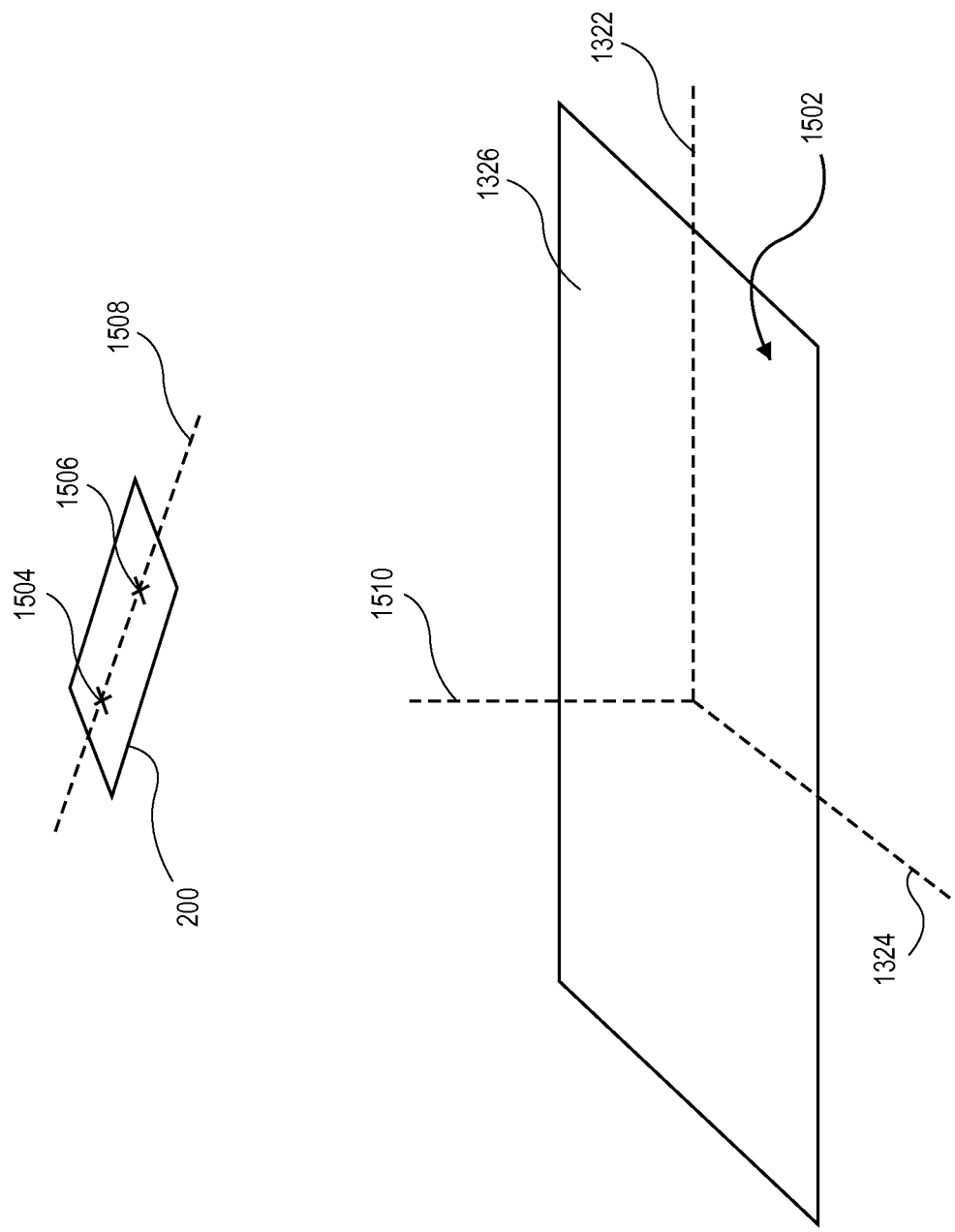
FIG. 15A is a perspective view schematic illustration of a method of aligning a substrate with a frame of reference in accordance with an embodiment of the invention.

Referring now to FIG. 15A, a perspective view schematic illustration of a method of aligning a substrate with a frame of reference is shown in accordance with an embodiment of the invention. This illustrates an aspect of operation 1220 of FIG. 12A. After a frame of reference is established, the substrate 200 can be aligned with the frame of reference. In an embodiment, the substrate 200 is aligned after establishing the frame of reference following by attaching the substrate 200 to a mounting surface 202 of the articulating transfer head assembly 106. The frame of reference is known based on the methods described above. More particularly, the frame of reference is established based on the identification or assignment of an x-axis 1322, a y-axis 1324, and an x-y plane 1326. Furthermore, a position of the substrate 200 relative to the frame of reference 1502 can be determined based on the various sensors of the mass transfer tool 100. For example, an upward-looking imaging device 1406 can view a first alignment marker 1504 of the substrate 200, and based on the position difference of the upward-looking imaging device 1406 while viewing the first alignment marker 1504 and while viewing a fiducial mark 1006 that coincides with an x-y datum 1320, the relative position of the first alignment marker 1504 along the x-axis 1322 and y-axis 1324 can be determined. It will be appreciated that such position difference can be determined, for example, from data provided by an encoder of an actuator subassembly 110. More particularly, an x-y stage 112 used to move the upward-looking imaging device 1406, or a carriage 120 that the imaging device is coupled with, can include a rotary encoder to provide data related to the position of the x-y stage 112, and hence the position of the upward-looking imaging device 1406. Likewise, a position of a second alignment marker 1506 can be determined relative to the x-y datum 1320.

Having identified at least two alignment markers 1504, 1506 on the substrate surface, an alignment axis 1508 can be calculated as running through the first alignment marker 1504 and the second alignment marker 1506. Furthermore, a comparison can be made between the alignment axis 1508 and an axis of the frame of reference, e.g., the x-axis 1322, to determine the orientation of the substrate 200 relative to the frame of reference 1502 about a z-axis 1510.

It will be appreciated that the first alignment marker 1504 and the second alignment marker 1506 can be any known marker that is disposed on the substrate 200. For example, in an embodiment, the alignment markers can be added to the substrate 200 using ink or laser printing, or even etching. Alternatively, the alignment markers can be two or more electrostatic transfer heads from an array of electrostatic transfer heads 204. For example, two electrostatic transfer heads along an outer edge of the array 204 could create an alignment axis 1508 that coincides with, and allows referencing to, the outer edge of the array 204.

An angular relation between the substrate 200 and the x-y plane 1326 can also be determined using an upward-looking position sensor 1406. Two or more points on the substrate 200 surface can be detected by the upward-looking position sensor 1406. For example, in an embodiment, four points on the substrate 200 surface can be detected by the upward-looking position sensor 1406. The distances to the points can be used to calculate a plane passing through the points, i.e., a plane coinciding with the surface of the substrate 200. This surface can be, for example, the contact surfaces 205 on the array of electrostatic transfer heads 204 such as the dielectric layer over the array of electrodes. Thus, a comparison can be made between the substrate surface and the x-y plane 1326 of the frame of reference 1502 to determine the orientation of the substrate 200 relative to the frame of reference 1502 about the x-axis 1322 and y-axis 1324.

Figure 15B:
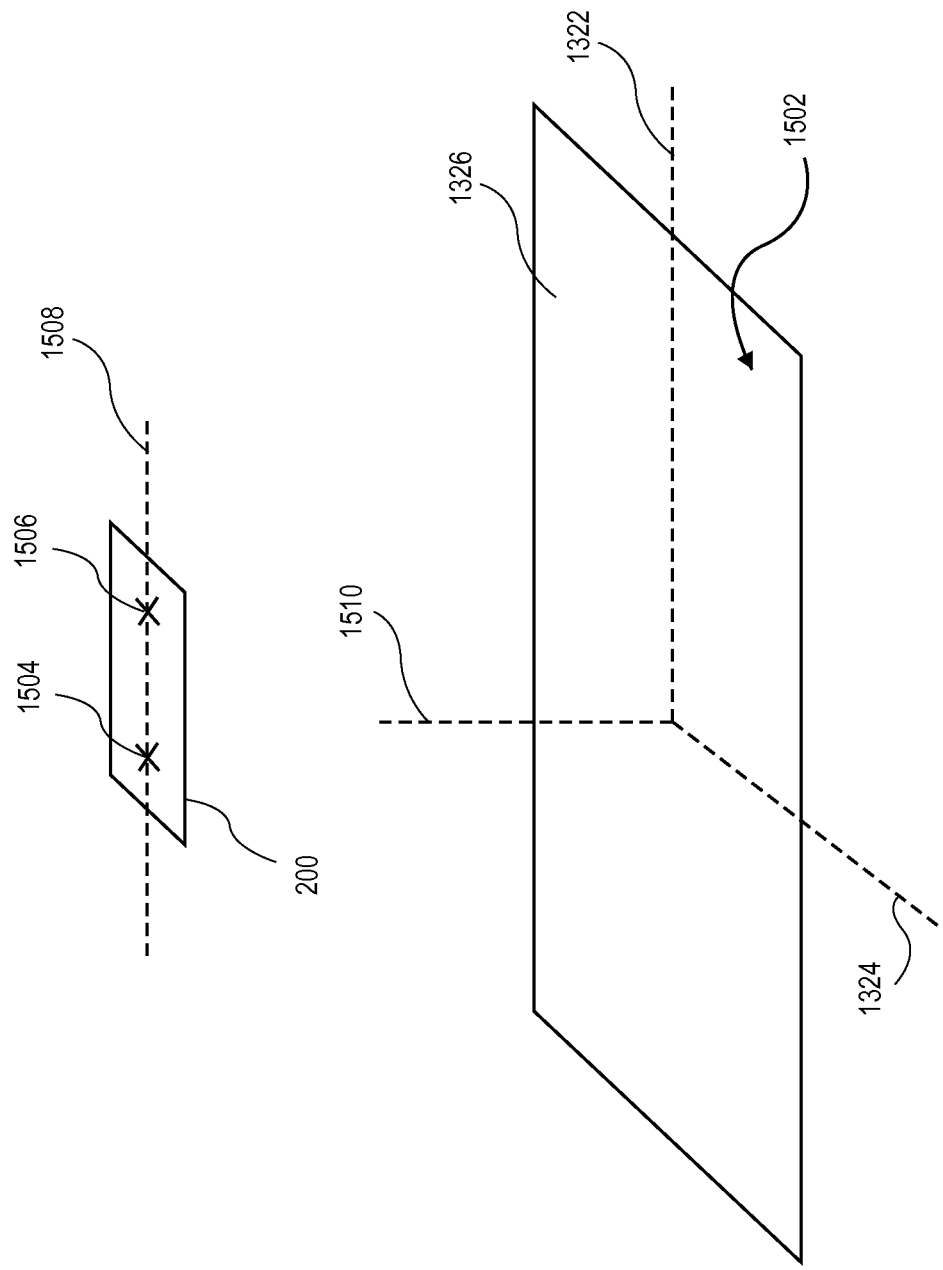
FIG. 15B is a perspective view schematic illustration of a method of aligning a substrate with a frame of reference in accordance with an embodiment of the invention.

Referring to FIG. 15B, a perspective view schematic illustration of a method of aligning a substrate with a frame of reference is shown in accordance with an embodiment of the invention. This illustrates an aspect of operation 1220 of FIG. 12A. Based on the relationship between the frame of reference 1502 and the substrate 200, the substrate 200 can be aligned with the frame of reference 1502. More particularly, the articulating transfer head assembly 106 can be adjusted within several degrees of freedom in order to align the alignment axis 1508 of the substrate 200 parallel to the x-axis 1322 and in order to align the substrate surface parallel to the x-y plane 1326. This can be achieved by tipping, tilting, and rotating the articulating transfer head assembly 106 using various actuators of the actuator assembly 110.

In an alternative embodiment, alignment of the substrate 200 with the frame of reference 1502 can include viewing two or more points on the substrate 200, e.g., alignment markers 1504, 1506, with an imaging device to determine that the substrate 200 is parallel to an imaging plane of the imaging device. More specifically, an upward-viewing imaging device can view at least two points on the substrate 200 and the focal length for detecting those points can be determined. For example, a first electrostatic head, or an alignment marker 1504, can be viewed and brought into focus by the imaging device. When the first electrostatic head is in focus, the image has a first focal length. The imaging device can then be used to view a second electrostatic head or alignment marker 1506 by moving imaging device to a new location in the same plane. If the electrostatic heads or alignment markers 1504, 1506 are the same distance from the imaging plane, then there will be no need to refocus, since the focal length will be the same for each. However, if the imaging device must refocus to bring the second electrostatic head into focus, then the focal lengths are different, and the substrate surface supporting the array of electrostatic heads is not parallel with the imaging plane. The articulating transfer head assembly 106 can therefore be tipped and tilted until the imaging device does not need to refocus when moving between locations to view the reference points on the substrate 200. When this occurs refocusing is not required, and hence substrate 200, is parallel to a corresponding plane of the frame of reference.

Having now described a method of aligning substrate 200 with the frame of reference 1502, it will now be understood that the frame of reference is useful for enabling the alignment of various components within mass transfer tool 100. More specifically, the frame of reference allows for the movement of system components relative to reference geometries and to each other. Movement of these components can be monitored and input to a computer system 150 that controls actuator assembly 110. By way of example, after establishing a frame of reference, movement of the carrier substrate holder 108 mounted on a carriage 120 attached to an x-y stage 112 can be determined by an encoder of the x-y stage 112. Thus, if the x-y stage 112 moves along a y-axis for 3 inches, then the encoder would determine that the carrier substrate holder 108 has changed positions in the y-axis direction by 3 inches. Similarly, a position change between the carrier substrate holder 108 and the articulating transfer head assembly 106 is known to be 3 inches in the y-axis direction if the articulating transfer head assembly 106 has remained stationary during the move. This is a basic demonstration of the importance of establishing a frame of reference, and indicates that the frame of reference can be used to determine relative positions between many different components throughout the system. As such, the following description will go into greater detail regarding aspects of the method shown in FIG. 12C, which utilize the ability to move components relative to each other to transfer an array of micro devices from a carrier substrate to a receiving substrate.

Referring again to FIG. 12C, at operation 1230 an orientation of a carrier substrate 706 can be determined. For example, the carrier substrate can be held on a holding surface 802 that applies vacuum to retain and stabilize the carrier substrate 706. Alternatively, mechanical gripping mechanisms or friction fits can be used to retain the carrier substrate 706. The carrier substrate 706 orientation can be determined using methods similar to those described above for determining the orientation of the substrate 200 attached to the mounting surface 202. For example, a downward-viewing imaging device can view several markers on the carrier substrate 706 to determine the relative distance of the markers to the x-y datum 1320 of the frame of reference. This determination can be used to determine an orientation of the carrier substrate 706 about a z-axis of the frame of reference. Furthermore, a downward-viewing position sensor 1402 can be used to detect several points on a surface of the carrier substrate 706 in order to determine an orientation of the carrier substrate 706 about an x-axis and a y-axis of the frame of reference. For example, the downward-viewing position sensor 1402 can be used to detect four points on the surface of the carrier substrate 706. Thus, an alignment axis and a surface orientation can be determined for the carrier substrate 706 to determine the relation of the carrier substrate 706 within the frame of reference.

At operation 1240 the orientation of the receiving substrate 714 can be determined in a manner similar to that described above with regard to operation 1230 of FIG. 12C. For example, a receiving substrate 714 can be held on a receiving substrate holder in a manner similar to that described above with regard to the carrier substrate 706.

After determining the orientation of the carrier substrate 706 and the receiving substrate 124, transfer of the micro devices from the carrier substrate 706 to the receiving substrate 124 can be performed. In some embodiments, transfer of the array of micro devices from the carrier substrate to the receiving substrate may be performed at an elevated temperature, for example to create a phase change in a bonding layer connecting the array of micro devices to the carrier substrate, or to create a phase change or alloy a bonding layer when placing the array of micro devices on the receiving substrate.

Figure 16A:
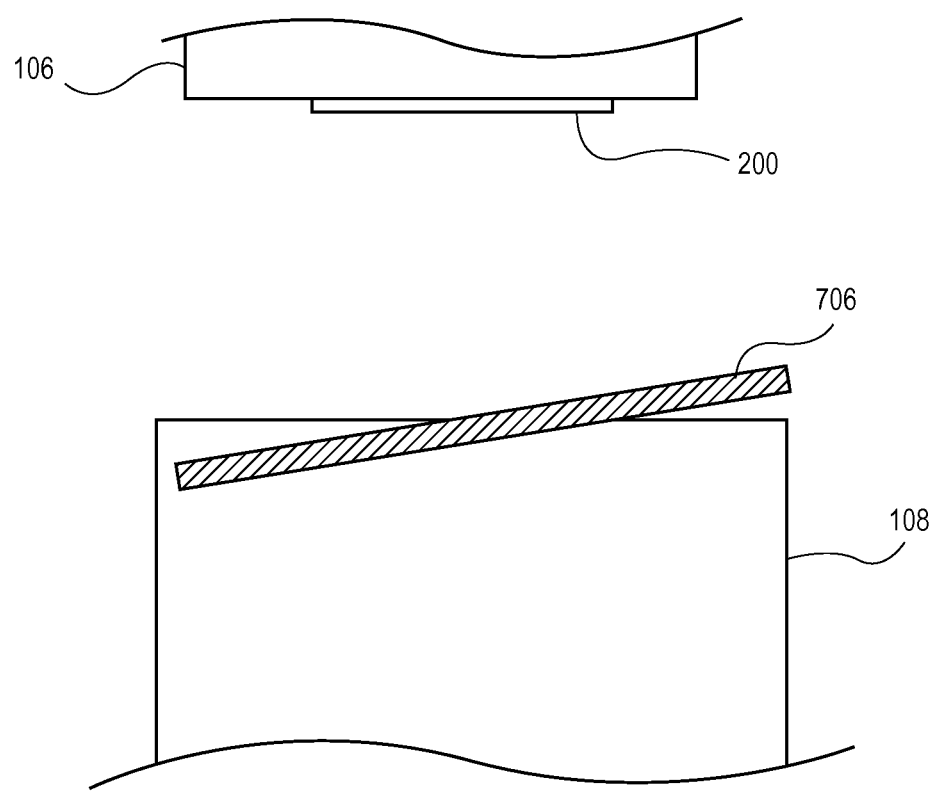
FIGS. 16A through 16C are side view schematic illustrations of a method of matching an orientation and contacting a substrate to a carrier substrate using a mass transfer tool in accordance with an embodiment of the invention.
Figure 16B:
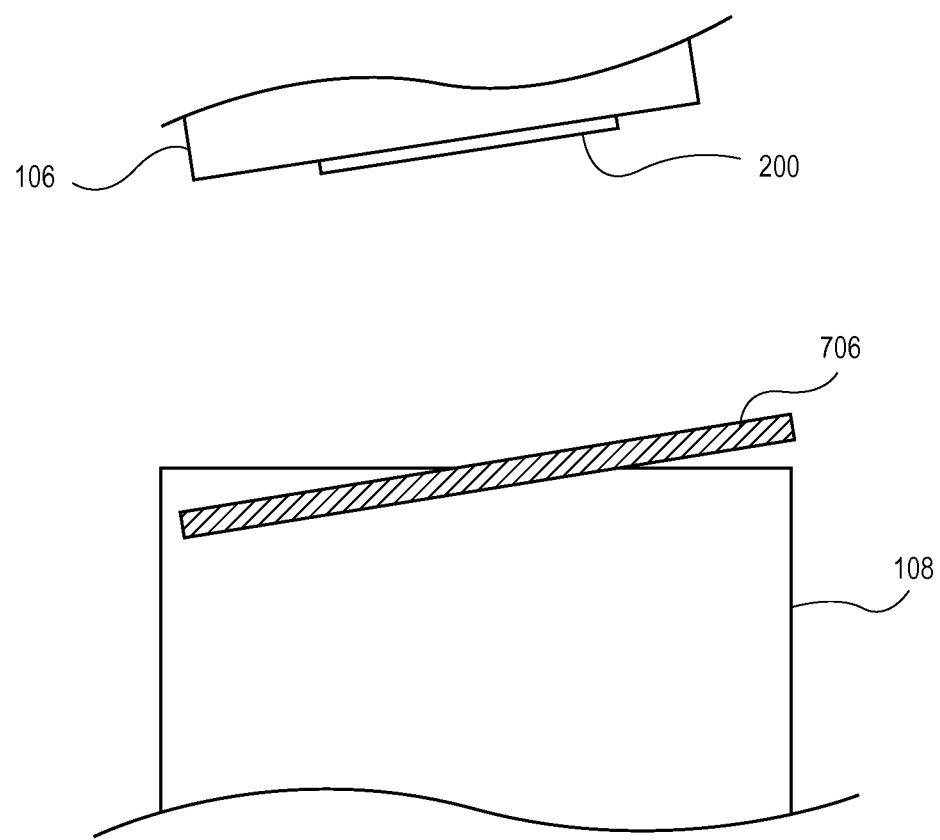
Figure 16C:
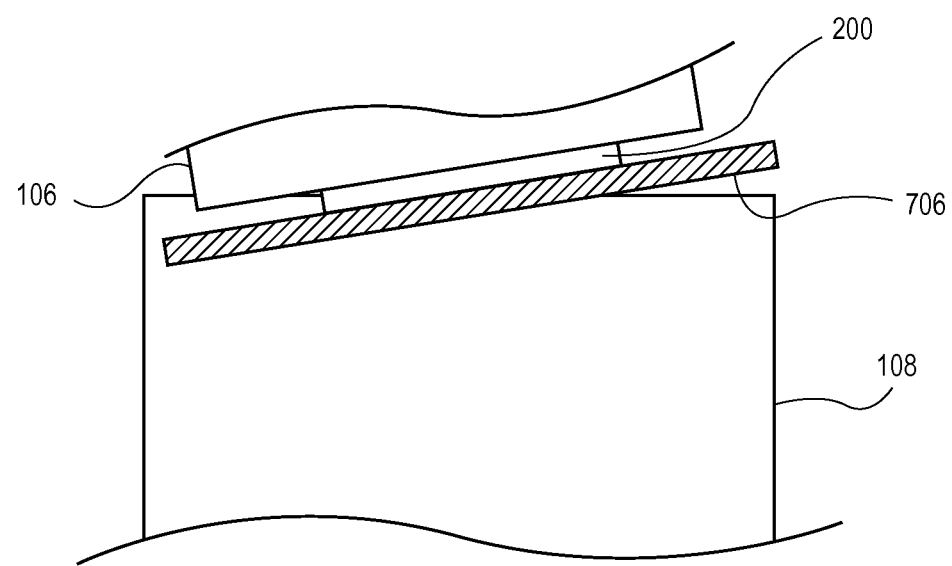

FIGS. 16A through 16C are side view schematic illustrations of a method of matching an orientation and contacting a substrate to a carrier substrate using a mass transfer tool in accordance with an embodiment of the invention. These illustrate additional aspects of operations 1240 and 1245 of FIG. 12C. For illustrational purposes a difference in orientation of the carrier substrate 706 with regard to the substrate 200 and a holding surface of the carrier substrate holder 108 is exaggerated.

Referring now to FIG. 16A, a substrate 200 is shown attached to the articulating transfer head assembly 106. The orientation of the substrate 200 is shown already aligned with a frame of reference. More specifically, the substrate is shown with an alignment axis and a surface that are aligned with the x-axis and the x-y plane of the frame of reference, respectively. It will be appreciated that in at least one embodiment, the substrate can be aligned with other reference geometries of the frame of reference.

A carrier substrate 706 is shown mounted on a carrier substrate holder 108. The orientation of the carrier substrate 706, unlike the substrate 200, is not aligned with the frame of reference. Thus, the orientations of the substrate 200 and the carrier substrate 706 are not aligned. However, the mismatch between these orientations can be determined. For example, the orientation of the substrate 200 and carrier substrate 706 is known based on the alignment with the frame of reference, as described above. Thus, a comparison can be performed to determine the offset in orientation between the carrier substrate 706 and the substrate 200.

It will be appreciated that the orientation of the carrier substrate holder 108 can also be determined, rather than the orientation of the carrier substrate 706. More specifically, surface points on the carrier substrate holder 108 that are approximately parallel to the surface of the carrier substrate 706 can be detected to define an orientation of the carrier substrate holder 108. A comparison can then be performed to determine the offset in orientation between the carrier substrate holder 108 and the substrate 200.

Referring to FIG. 16B, the spatial relationship between the articulating transfer head assembly 106 and the carrier substrate holder 108 can be adjusted to align the substrate 200 and the carrier substrate 706. This illustrates an aspect of operation 1245 of FIG. 12C. More specifically, after determining the orientation of the carrier substrate 706 as shown in FIG. 16A, the articulating transfer head assembly 106 can be moved by one or more actuators until the substrate 200 orientation is transformed to match the orientation of the carrier substrate 706. Then, the substrate 200 and the carrier substrate 706 are in proximity with each other and their facing surfaces are parallel.

Referring to FIG. 16C, an array of electrostatic transfer heads 204 supported by the substrate 200 is brought into contact with an array of micro devices on carrier substrate 706. This illustrates an aspect of the pick up operation 1250 of FIG. 12C. This can be achieved by moving the articulating transfer head assembly 106 toward the carrier substrate holder 108 using one or more actuators of the actuator assembly 110. It will be appreciated that due to the precise alignment of the substrate 200 and carrier substrate 706, contact is made while the substrate 200 and carrier substrate 706 are oriented substantially parallel to each other. Thus, there is minimal side loading or flexing of the facing surfaces at the point of contact. This is beneficial because it can prevent mismatch between the array of electrostatic heads 204 and one or more micro devices disposed on the carrier substrate surface. It also reduces the risk of damage to the array of electrostatic heads 204 and the one or more micro devices. Pick up operation 1250 can be performed in a variety of manners, and using a variety of sensors. For example, pick up operation 1250 can be performed similarly as the pick up operation describe above with regard to FIG. 17.

Referring again to FIG. 12C, operations 1255 and 1260 can be performed to transfer the picked up micro devices to a receiving substrate 714. These operations can be performed in a manner similar to operations 1245 and 1250 described above, as well as FIG. 17 above. More specifically, at operation 1255, a spatial relationship between articulating transfer head assembly 106 and receiving substrate holder 124 can be adjusted to bring the array of micro devices picked up by the array of electrostatic transfer heads 204 into proximity with a surface of the receiving substrate 714. Furthermore, contact between the receiving substrate 714 and the array of micro devices can be made through further actuation of the mass transfer tool 100. Contact between the array of micro devices 708 and the receiving substrate 714 can be sensed using position sensors, force gauges, and other sensors, in a manner similar to those described above. In some embodiments, placement of the array of micro devices on a receiving substrate may be performed at an elevated temperature, for example to create a phase change or alloy a bonding layer during placement of the array of micro devices on the receiving substrate.

At operation 1260, when the array of micro devices is in contact with the receiving substrate 714, the voltage applied to the array of electrostatic transfer heads 204 through the electrostatic voltage source connection 410 can be removed. Such removal may also remove the gripping pressure to release the array of micro devices onto the receiving substrate 714.

After releasing the array of micro devices, the transfer of the micro devices from the carrier substrate 706 to the receiving substrate 714 is achieved. Subsequently, the articulating transfer head assembly 106 can be moved away from the receiving substrate 714. Both the moving and sensing of removal the array of micro devices can be achieved in a manner similar to those described above. Additionally, the array of electrostatic transfer heads 204 can be inspected by an upward-viewing imaging device 128 to confirm the release of the array of micro device, a similar manner to that described above.

It will be appreciated that various components of the mass transfer tool can be heated during the operations described above. For example, in an embodiment, the substrate 200 supporting the array of electrostatic transfer heads 204 and/or mounting surface 202 can be heated to a temperature range of about 100 to 350 degrees Celsius during any of the operations 1201 through 1260. For example, any of the sensing, alignment, and matching operation can be performed at an operating temperature used for transfer of the micro devices from the carrier substrate to the receiving substrate. In an embodiment, the operating temperature is an elevated temperature for creating a phase change or alloying of a bonding layer. In an embodiment, the mounting surface 202 is heated to a temperature range of about 100 to 350 degrees Celsius when setting the x-y datum and z-datum in operations 1203 and 1205. In an embodiment, the mounting surface 202 and substrate 200 are heated to a temperature range of about 100 to 350 degrees Celsius when aligning the substrate with a frame of reference. In an embodiment, the mounting surface 202 and substrate 200 are heated to a temperature range of about 100 to 350 degrees Celsius when determining an orientation of the carrier or receiving substrate and matching the orientation of the substrate to the orientation of the carrier or receiving substrate. In an embodiment, the mounting surface 202 and substrate 200 are heated to a temperature range of about 100 to 350 degrees Celsius when contacting, picking up, or releasing the array of micro devices. In an embodiment, the carrier substrate is heated to a temperature range from room temperature to about 200 degrees Celsius when setting the x-y datum and x-datum in operations 1203 and 1205. In an embodiment, the carrier or receiving substrate is heated to a temperature range from room temperature to about 200 degrees Celsius when determining an orientation of the carrier or receiving substrate and matching the orientation of the substrate to the orientation of the carrier or receiving substrate. In an embodiment, the carrier substrate 706 can be heated to a temperature range from room temperature to about 200 degrees Celsius while the array of micro devices on the carrier substrate 706 is contacted by the array of electrostatic transfer heads 204. In an embodiment, the receiving substrate 714 can be heated to a temperature range of about 100 to 200 degrees Celsius while the receiving substrate 714 is contacted by the array of electrostatic transfer heads 204. These are only examples and it will be appreciated that these or other components of the mass transfer tool 100 can be heated to these or different temperature ranges within the scope of the methods described above.

Figure 20:
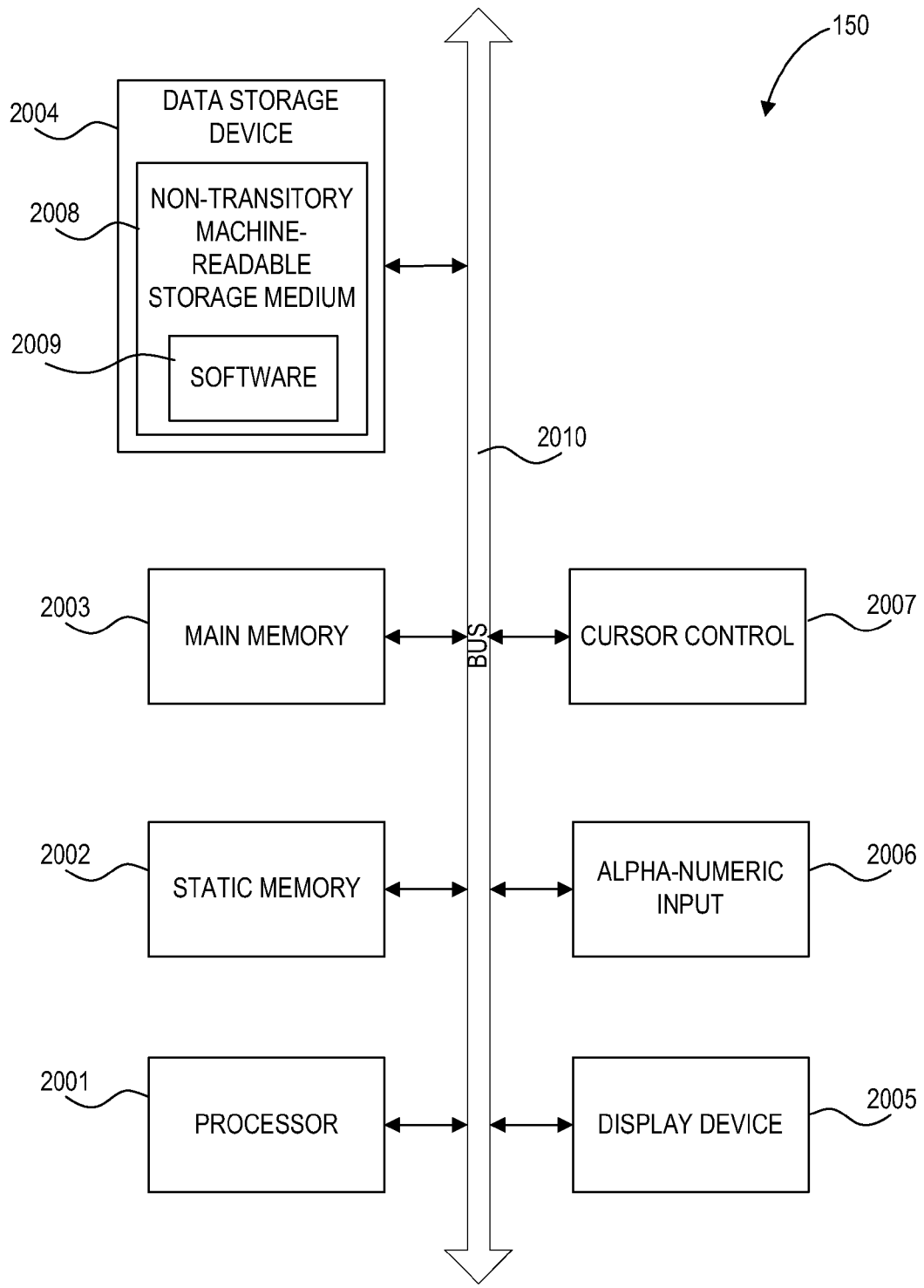
FIG. 20 is a schematic illustration of an exemplary computer system 150 that may be used in accordance with an embodiment of the invention.

With reference now to FIG. 20, portions of embodiments of the invention are comprised of, or controlled by, non-transitory machine-readable and machine-executable instructions which reside, for example, in machine-usable media of a computer control system. FIG. 20 is a schematic illustration of an exemplary computer system 150 that may be used in accordance with an embodiment of the invention. It is to be appreciated that computer system 150 is exemplary, and that embodiments of the invention can operate on or within, or be controlled by a number of different computer systems including general purpose networked computer systems, embedded computer systems, routers, switches, server devices, client devices, various intermediate devices/nodes, stand alone computer systems, and the like.

Computer system 150 of FIG. 20 includes an address/data bus 2010 for communicating information, and a central processor unit 2001 coupled to bus 2010 for processing information and instructions. System 150 also includes data storage features such as a computer usable volatile memory 2002, e.g. random access memory (RAM), coupled to bus 1210 for storing information and instructions for central processor unit 2001, computer usable non-volatile memory 2003, e.g. read only memory (ROM), coupled to bus 2010 for storing static information and instructions for the central processor unit 2001, and a data storage device 2004 (e.g., a magnetic or optical disk and disk drive) coupled to bus 2010 for storing information and instructions. System 2012 of the present embodiment also includes an optional alphanumeric input device 1206 including alphanumeric and function keys coupled to bus 2010 for communicating information and command selections to central processor unit 2001. System 150 also optionally includes an optional cursor control device 2007 coupled to bus 2010 for communicating user input information and command selections to central processor unit 1201. System 2012 of the present embodiment also includes an optional display device 2005 coupled to bus 210 for displaying information.

The data storage device 2004 may include a non-transitory machine-readable storage medium 2008 on which is stored one or more sets of instructions (e.g. software 2009) embodying any one or more of the methodologies or operations described herein. Software 2009 may also reside, completely or at least partially, within the volatile memory 2002, non-volatile memory 2003, and/or within processor 2001 during execution thereof by the computer system 150, the volatile memory 2002, non-volatile memory 2003, and processor 2001 also constituting non-transitory machine-readable storage media.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A mass transfer tool comprising:
   an articulating transfer head assembly including an electrostatic voltage source connection, the electrostatic voltage source connection to electrically connect with an array of electrostatic transfer heads, wherein the articulating transfer head assembly includes a mounting surface, the mounting surface to hold a substrate supporting the array of electrostatic transfer heads against the electrostatic voltage source connection;
   a carrier substrate holder; and
   an actuator assembly to adjust a spatial relationship between the articulating transfer head assembly and the carrier substrate holder.

2. The mass transfer tool of claim 1, wherein the electrostatic voltage source connection includes a resilient conductor to press against the substrate and to electrically connect the substrate with the electrostatic voltage source connection.

3. The mass transfer tool of claim 1, wherein the actuator assembly includes a first flexure coupled with the articulating transfer head assembly to constrain movement of the articulating transfer head assembly in a direction orthogonal to the mounting surface.

4. The mass transfer tool of claim 3, wherein the actuator assembly includes a second flexure coupled with the articulating transfer head assembly, and wherein the second flexure includes a second flexing surface oriented substantially parallel to a first flexing surface of the first flexure.

5. The mass transfer tool of claim 1, further comprising a first position sensor fixed relative to the mounting surface of the articulating transfer head assembly to detect a position of a carrier substrate on the carrier substrate holder.

6. The mass transfer tool of claim 1, further comprising a heater to heat the mounting surface.

7. The mass transfer tool of claim 1, further comprising a second electrostatic voltage source connection, the second electrostatic voltage source connection to electrically connect with the array of electrostatic transfer heads.

8. The mass transfer tool of claim 7, wherein the electrostatic voltage source connection includes a resilient conductor to press against the substrate and to electrically connect the substrate with the electrostatic voltage source connection, and the second electrostatic voltage source connection includes a second resilient conductor to press against the substrate and to electrically connect the substrate with the second electrostatic voltage source connection.

9. The mass transfer tool of claim 1, further comprising a force gauge coupled with the carrier substrate holder to measure a force applied to the carrier substrate holder.

10. The mass transfer tool of claim 1, further comprising a heater to heat the carrier substrate holder.

11. A mass transfer tool, comprising:
    an articulating transfer head assembly including an electrostatic voltage source connection, the electrostatic voltage source connection to electrically connect with an array of electrostatic transfer heads;
    a carrier substrate holder; and
    an actuator assembly to adjust a spatial relationship between the articulating transfer head assembly and the carrier substrate holder, wherein the actuator assembly is to adjust a spatial relationship between the articulating transfer head assembly and the carrier substrate holder in at least six degrees of freedom.

12. The mass transfer tool of claim 11, wherein the actuator assembly includes a first actuator subassembly coupled with the articulating transfer head assembly to adjust an articulating transfer head assembly position in at least four degrees of freedom and a second actuator subassembly coupled with the carrier substrate holder to adjust a carrier substrate holder position in at least two degrees of freedom.

13. The mass transfer tool of claim 12, wherein the first actuator subassembly includes a flexure coupled with the articulating transfer head assembly to constrain movement of the articulating transfer head assembly in a direction orthogonal to a mounting surface of the articulating transfer head assembly.

14. The mass transfer tool of claim 13, further comprising a first position sensor fixed relative to the mounting surface of the articulating transfer head assembly to detect a position of a carrier substrate on the carrier substrate holder.

15. The mass transfer tool of claim 14, further comprising a second position sensor fixed relative to the carrier substrate holder to detect the articulating transfer head assembly position.

16. The mass transfer tool of claim 15, further comprising a third position sensor coupled with the actuator assembly to detect a deflection of the flexure.

17. A mass transfer tool, comprising:
    an articulating transfer head assembly including an electrostatic voltage source connection, the electrostatic voltage source connection to electrically connect with an array of electrostatic transfer heads;
    a carrier substrate holder;
    an actuator assembly to adjust a spatial relationship between the articulating transfer head assembly and the carrier substrate holder;
    a fiducial mark;
    a first imaging device fixed relative to the articulating transfer head assembly and moveable relative to the fiducial mark, wherein the first imaging device includes a first imaging plane; and
    a second imaging device fixed relative to the carrier substrate holder, wherein the second imaging device includes a second imaging plane, and wherein the fiducial mark is located between the first imaging plane and the second imaging plane.

18. The mass transfer tool of claim 17, wherein one or more of the first imaging device or the second imaging device includes a camera.

\* \* \* \* \*